United States Patent
Chen et al.

(10) Patent No.: US 11,043,561 B2
(45) Date of Patent: *Jun. 22, 2021

(54) MULTI-GATE DEVICE AND METHOD OF FABRICATION THEREOF

(71) Applicant: Taiwan Semiconductor Manufacturing Company, Ltd., Hsinchu (TW)

(72) Inventors: I-Sheng Chen, Hsinchu (TW); Cheng-Hsien Wu, Hsinchu (TW); Chih Chieh Yeh, Taipei (TW); Yee-Chia Yeo, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/723,559

(22) Filed: Dec. 20, 2019

(65) Prior Publication Data

US 2020/0135862 A1    Apr. 30, 2020

Related U.S. Application Data

(60) Continuation of application No. 16/195,389, filed on Nov. 19, 2018, now Pat. No. 10,522,625, which is a (Continued)

(51) Int. Cl.
*H01L 29/10*    (2006.01)
*H01L 29/06*    (2006.01)
(Continued)

(52) U.S. Cl.
CPC .. *H01L 29/1054* (2013.01); *H01L 21/823807* (2013.01); *H01L 27/088* (2013.01);
(Continued)

(58) Field of Classification Search
CPC ............. H01L 29/1054; H01L 29/7853; H01L 29/66795; H01L 29/7856; H01L 29/0673;
(Continued)

(56) References Cited

U.S. PATENT DOCUMENTS 7,425,740 B2   9/2008   Liu et al.
7,663,166 B2   2/2010   Kim et al.
(Continued)

OTHER PUBLICATIONS

Ando, T. et al. Understanding Mobility Mechanisms in Extremely Scaled HfO2 (EOT 0.42 nm) Using Remote Interfacial Layer Scavenging Technique and Vt-tuning Dipoles with Gate-First Process, IEEE 2009, pp. 09-424-09-426.
(Continued)

*Primary Examiner* — Dao H Nguyen
(74) *Attorney, Agent, or Firm* — Haynes and Boone, LLP

(57) ABSTRACT

A semiconductor device includes a fin extending from a substrate. The fin has a source/drain region and a channel region. The channel region includes a first semiconductor layer and a second semiconductor layer disposed over the first semiconductor layer and vertically separated from the first semiconductor layer by a spacing area. A high-k dielectric layer at least partially wraps around the first semiconductor layer and the second semiconductor layer. A metal layer is formed along opposing sidewalls of the high-k dielectric layer. The metal layer includes a first material. The spacing area is free of the first material.

20 Claims, 39 Drawing Sheets

Related U.S. Application Data continuation of application No. 15/600,441, filed on May 19, 2017, now Pat. No. 10,134,843, which is a division of application No. 14/994,399, filed on Jan. 13, 2016, now Pat. No. 9,660,033.

(51) Int. Cl.

| | |
|---|---|
| *H01L 29/165* | (2006.01) |
| *H01L 29/423* | (2006.01) |
| *H01L 29/66* | (2006.01) |
| *H01L 29/786* | (2006.01) |
| *H01L 29/78* | (2006.01) |
| *H01L 27/088* | (2006.01) |
| *H01L 27/092* | (2006.01) |
| *H01L 21/8238* | (2006.01) |

(52) U.S. Cl.
CPC ........ *H01L 27/092* (2013.01); *H01L 29/0673* (2013.01); *H01L 29/165* (2013.01); *H01L 29/42392* (2013.01); *H01L 29/66742* (2013.01); *H01L 29/66795* (2013.01); *H01L 29/7853* (2013.01); *H01L 29/7856* (2013.01); *H01L 29/78696* (2013.01); *H01L 21/82385* (2013.01)

(58) Field of Classification Search
CPC ............. H01L 29/165; H01L 29/42392; H01L 29/66742; H01L 29/78696; H01L 29/42356; H01L 21/823807; H01L 21/82385; H01L 27/088; H01L 27/092
USPC ................. 438/283, 478; 257/192, 327, 401, 257/E21.409, E29.022, E29.128, E29.345
See application file for complete search history.

(56) References Cited

U.S. PATENT DOCUMENTS

| | | | |
|---|---|---|---|
| 8,048,723 B2 | 11/2011 | Chang et al. | |
| 8,053,299 B2 | 11/2011 | Xu | |
| 8,183,627 B2 | 5/2012 | Currie | |
| 8,415,718 B2 | 4/2013 | Xu | |
| 8,497,177 B1 | 7/2013 | Chang et al. | |
| 8,597,995 B2 | 12/2013 | Xu | |
| 8,609,518 B2 | 12/2013 | Wann et al. | |
| 8,618,556 B2 | 12/2013 | Wu et al. | |
| 8,633,516 B1 | 1/2014 | Wu et al. | |
| 8,679,962 B2 | 3/2014 | Hou et al. | |
| 8,703,565 B2 | 4/2014 | Chang et al. | |
| 8,742,509 B2 | 6/2014 | Lee et al. | |
| 8,766,379 B2 | 7/2014 | Liu et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,263,338 B2 | 2/2016 | Liu et al. | |
| 9,508,712 B2 | 11/2016 | Wahl et al. | |
| 9,570,551 B1 | 2/2017 | Balakrishnan et al. | |
| 9,590,089 B2 | 3/2017 | Rachmady et al. | |
| 9,660,033 B1 * | 5/2017 | Chen | H01L 21/823807 |
| 9,711,506 B2 | 7/2017 | Yang et al. | |
| 9,716,145 B2 * | 7/2017 | Balakrishnan | H01L 29/42392 |
| 10,134,843 B2 * | 11/2018 | Chen | H01L 29/165 |
| 10,522,625 B2 * | 12/2019 | Chen | H01L 29/7853 |
| 2008/0017934 A1 * | 1/2008 | Kim | H01L 29/0657 257/401 |
| 2014/0091402 A1 | 4/2014 | Hou et al. | |
| 2016/0204195 A1 * | 7/2016 | Wen | H01L 29/66439 257/347 |
| 2016/0372474 A1 * | 12/2016 | Yang | H01L 29/42392 |
| 2017/0005195 A1 | 1/2017 | Ching et al. | |
| 2017/0053912 A1 | 2/2017 | Ching et al. | |

OTHER PUBLICATIONS

Li, Xiuyan et al. Analytical Formulation of SiO2/Si interface reaction, IEEE, 2014, pp. 14-534-14-537.

* cited by examiner

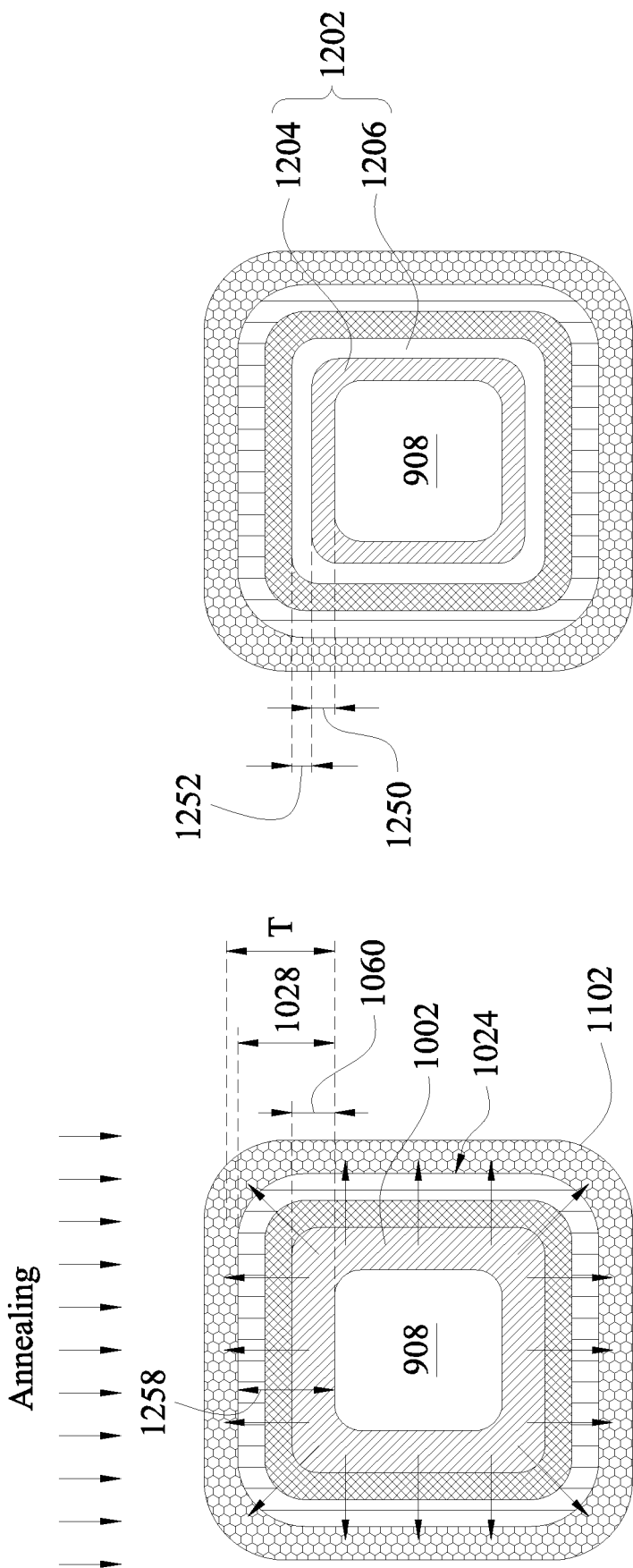

ously ranked 2,625, which is a continuation of U.S. patent application Ser. No. 15/600,441, filed May 19,
MULTI-GATE DEVICE AND METHOD OF FABRICATION THEREOF

CROSS-REFERENCE TO RELATED APPLICATION

The present application is a continuation application of U.S. patent application Ser. No. 16/195,389, issuing as U.S. Pat. No. 10,522,625, which is a continuation application of U.S. patent application Ser. No. 15/600,441, filed May 19, 2017 and issued as U.S. Pat. No. 10,134,843, which is a divisional application of U.S. patent application Ser. No. 14/994,399, entitled "MULTI-GATE DEVICE AND METHOD OF FABRICATION THEREOF," filed Jan. 13, 2016 and issued as U.S. Pat. No. 9,660,033, hereby incorporated by reference in their entirety.

BACKGROUND

The semiconductor industry has progressed into nanometer technology process nodes in pursuit of higher device density, higher performance, and lower cost. Despite groundbreaking advances in materials and fabrication, scaling planar device such as the conventional MOSFET has proven challenging. To overcome these challenges, circuit designers are looking to novel structures to deliver improved performance. One avenue of inquiry is the development of three-dimensional designs, such as a fin-like field effect transistor (FinFET). A FinFET can be thought of as a typical planar device extruded out of a substrate and into the gate. A typical FinFET is fabricated with a thin "fin" (or fin structure) extending up from a substrate. The channel of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

Continued FinFET scaling also presents critical challenges. For example, as FinFETs are scaled down through various technology nodes, gate stacks using gate dielectric materials having a high dielectric constant (e.g., high-k dielectrics) have been implemented. In implementing high-k/metal gate stacks, it is important to properly scale an equivalent oxide thickness (EOT) of the gate structure to improve device performance. However, an interfacial layer may be required between the gate dielectric layer (e.g., $HfO_2$) and the channel, which also contributes to the EOT of the gate structure. Furthermore, the interfacial layer may affect the flat band voltage and/or threshold voltage of FinFETs. Therefore, as the scale of FinFETs decreases, the thickness and/or uniformity of the interfacial layer become more and more critical.

Therefore, what is needed is an improved multi-gate structure and fabrication method.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 12A, 12B, 12C, and 12D are cross-sectional views of a portion of a semiconductor device according to some embodiments.

DETAILED DESCRIPTION

Figure 1A:
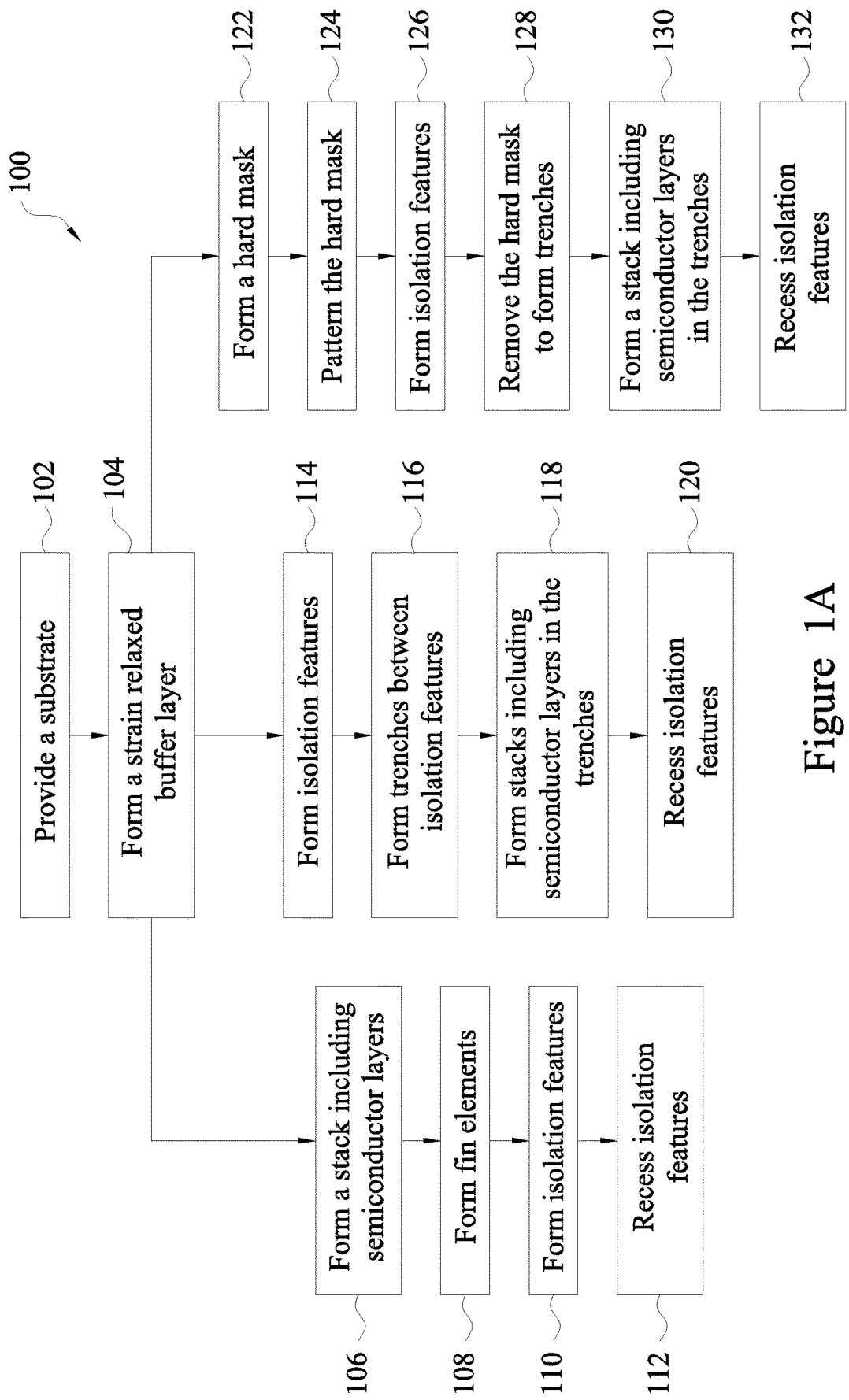
FIGS. 1A and 1B are flow charts of a method of fabricating a semiconductor device or portion thereof according to one or more aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET devices may be gate-all-around (GAA) devices, Omega-gate (Ω-gate) devices, Pi-gate (Π-gate) devices, dual-gate devices, tri-gate devices, bulk devices, silicon-on-insulator (SOI) devices, and/or other configuration. One of ordinary skill may recognize other examples of semiconductor devices that may benefit from aspects of the present disclosure.

Figure 2A:
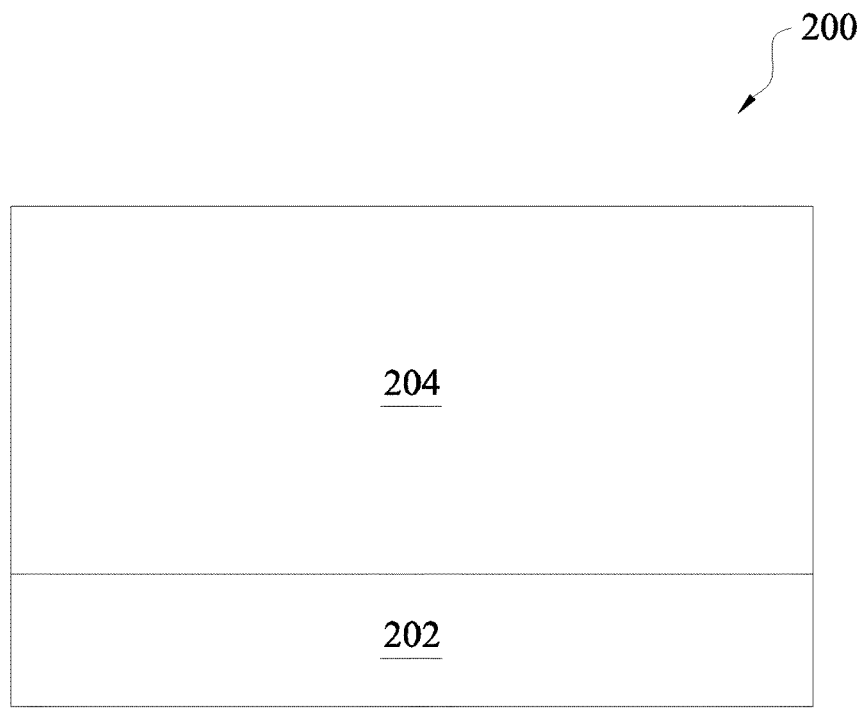
FIGS. 2A, 2B, 2C, 2D, and 2E are cross-sectional views of a portion of a semiconductor device according to an embodiment of the present disclosure.
Figure 2B:
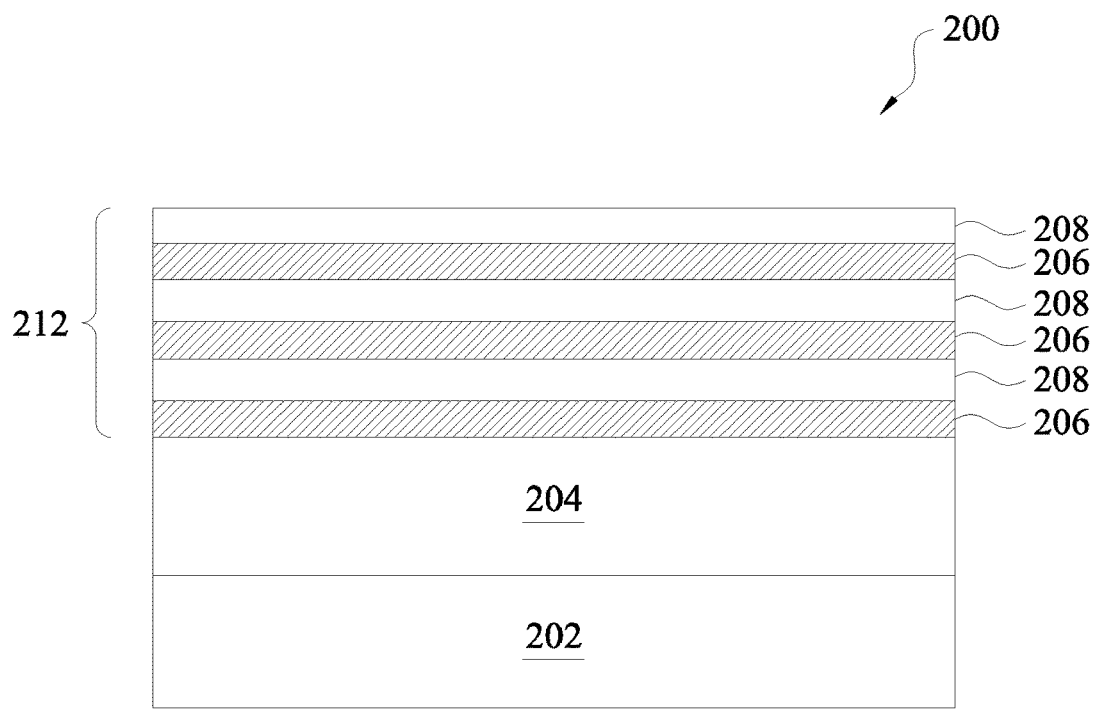

Illustrated in FIG. 1A is a method 100 of semiconductor fabrication for forming fin elements including semiconductor layers over a substrate. Referring to FIG. 1A, the method 100 begins at block 102, where a substrate is provided. Referring to the example of FIG. 2A, in an embodiment of block 102, a substrate 202 is provided. In some embodiments, the substrate 202 may be a semiconductor substrate such as a silicon substrate. The substrate 202 may also include other semiconductors such as germanium (Ge), silicon carbide (SiC), silicon germanium (SiGe), or diamond. Alternatively, the substrate 202 may include a compound semiconductor and/or an alloy semiconductor. The substrate 202 may include various layers, including conductive or insulating layers formed on a semiconductor substrate. The substrate 202 may include various doping configurations depending on design requirements as is known in the art. For example, different doping profiles (e.g., n wells, p wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 202 typically has isolation features (e.g., shallow trench isolation (STI) features) interposing the regions providing different device types. Further, the substrate 202 may optionally include an epitaxial layer (epi-layer), may be strained for performance enhancement, may include a silicon-on-insulator (SOI) structure, and/or have other suitable enhancement features.

Referring to FIG. 1A, the method 100 proceeds to block 104, where a strain relaxed buffer (SRB) layer 204 is grown over the substrate 202. Referring to the example of FIG. 2A, an SRB layer 204 is grown over the substrate 202 using atomic layer deposition (ALD), chemical vapor deposition (CVD), high-density plasma CVD (HDP-CVD), physical vapor deposition (PVD) and/or other suitable deposition processes. The SRB layer 204 may be different in composition from the substrate 202 in order to create lattice strain at the interface with the substrate 202. For example, in some embodiments, the substrate 202 includes silicon and is substantially free of Germanium while the SRB layer 204 includes SiGe. In various such examples, the SRB layer 204 has a germanium concentration in the range of about 25 atomic percent to about 100 atomic percent.

Referring to FIG. 1A, after forming the SRB layer 204 over the substrate 202 at block 104, various embodiments of the method 100 to form the fin elements over the substrate may be used. In one embodiment, the method 100 proceeds to block 106, where a stack including semiconductor layers are formed over the substrate. Referring to the example of FIG. 2A, a stack 212 of semiconductor layers is formed over the substrate 202. In embodiments that include an SRB layer 204 disposed on the substrate 202, the stack 212 of semiconductor layers may be disposed on the SRB layer 204. The stack 212 of semiconductor layers may include alternating layers of different compositions. For example, in some embodiments, the stack 212 includes semiconductor layers 206 of a first composition alternating with semiconductor layers 208 of a second composition. Although three semiconductor layers 206 and three semiconductor layers 208 are shown, it is understood that the stack 212 may include any number of layers of any suitable composition with various examples including between 2 and 10 semiconductor layer 206 and between 2 and 10 semiconductor layers 208. As explained below, the different compositions of the layers in the stack 212 (e.g., semiconductor layers 206 and semiconductor layers 208) may be used to selectively process some of the layers. Accordingly, the compositions may have different oxidation rates, etchant sensitivity, and/or other differing properties.

In some embodiments, either of the semiconductor layers 206 and 208 may include silicon. In some embodiments, either of the semiconductor layers 206 and 208 may include other materials such as Ge, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the semiconductor layers 206 and 208 may be undoped or substantially dopant-free (i.e., having an extrinsic dopant concentration from about 0 $cm^{-3}$ to about $1\times10^{17}$ $cm^{-3}$), where for example, no doping is performed during the epitaxial growth process. Alternatively, the semiconductor layers 208 may be doped. For example, the semiconductor layers 206 or 208 may be doped with a p-type dopant such as boron (B), aluminum (Al), indium (In), and gallium (Ga) for forming a p-type channel, or an n-type dopant such as phosphorus (P), arsenic (As), antimony (Sb), for forming an n-type channel.

The semiconductor layers 206 and 208 may have thicknesses chosen based on device performance considerations. In some embodiments, the semiconductor layer 206 has a thickness range of about 2-15 nanometers (nm). In some embodiments, the semiconductor layers 206 of the stack 212 may be substantially uniform in thickness. In some embodiments, the semiconductor layer 208 has a thickness range of about 2-15 nm. In some embodiments, the semiconductor layers 208 of the stack 212 are substantially uniform in thickness.

By way of example, growth of the layers of the stack 212 may be performed by a molecular beam epitaxy (MBE) process, a metalorganic chemical vapor deposition (MOCVD) process, and/or other suitable epitaxial growth processes.

Figure 2C:
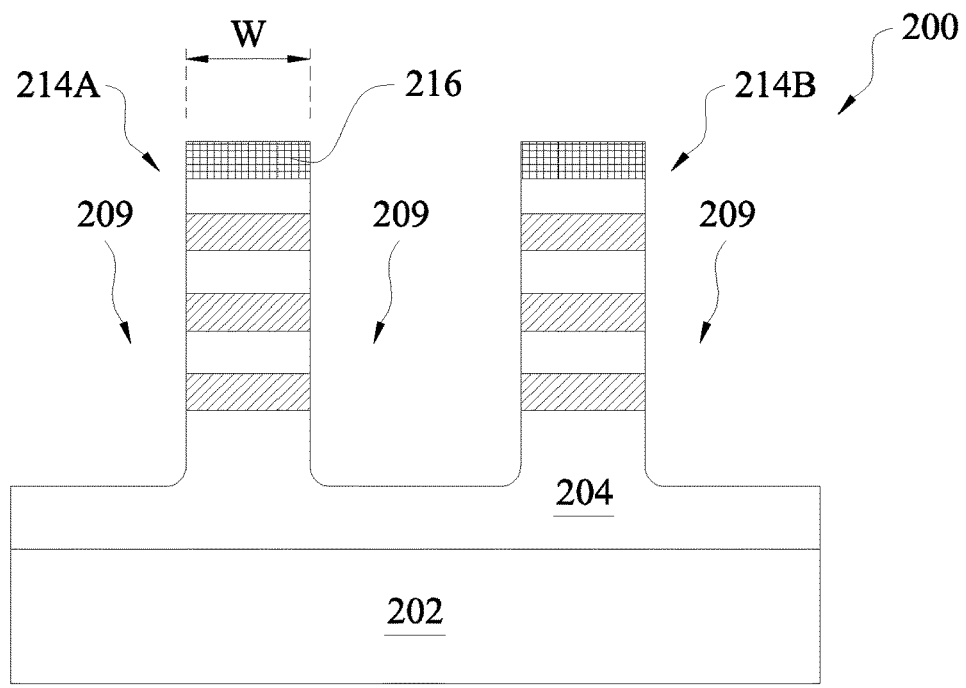

Referring to FIG. 1A, the method 100 proceeds to block 110, where fin elements are formed. Referring to the example of FIG. 2C, fin elements 214A and 214B may be fabricated using suitable processes including photolithography and etch processes. In some embodiments, a resist 216 is formed over the stack 212 and patterned using a lithography process. The patterned resist 216 may then be used to protect regions of the substrate 202, and layers formed thereupon, while an etch process forms trenches 209 in unprotected regions through the resist 216, through the stack 212, and into the SRB layer 204. The remaining portions of the stack 212 become fin elements 214A and 214B that include the semiconductor layers 206 and 208. In some embodiment, the patterns in resist 216 are controlled so as to result in a desired width W of the fin elements 214A and 214B. The width W may be chosen based on device performance considerations. In some embodiments, the width W is substantially the same as a thickness of the semiconductor layer 206 or 208, and has a range of about 2-15 nm.

Figure 2D:
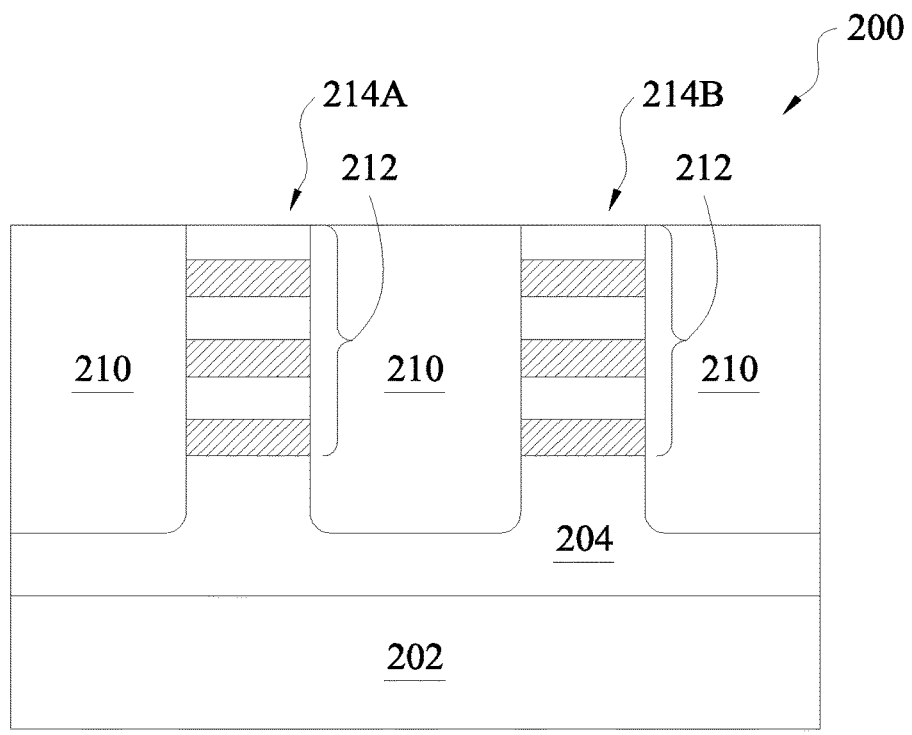

Referring to FIG. 1A, the method 100 proceeds to block 110, where isolation features are formed. Referring to the example of FIG. 2D, a dielectric material, such as silicon oxide, may be deposited into the trenches 209 to form isolation features 210. A chemical mechanical planarization (CMP) process may be performed to planarize a top surface of the device 200. In some embodiments, the CMP process used to planarize the top surface of the device 200 the isolation features 210 may also serve to remove the resist from the fin elements 214A and 214B. In some embodiments, removal of the resist may alternatively be performed by using a suitable etching process (e.g., dry or wet etching).

Figure 2E:
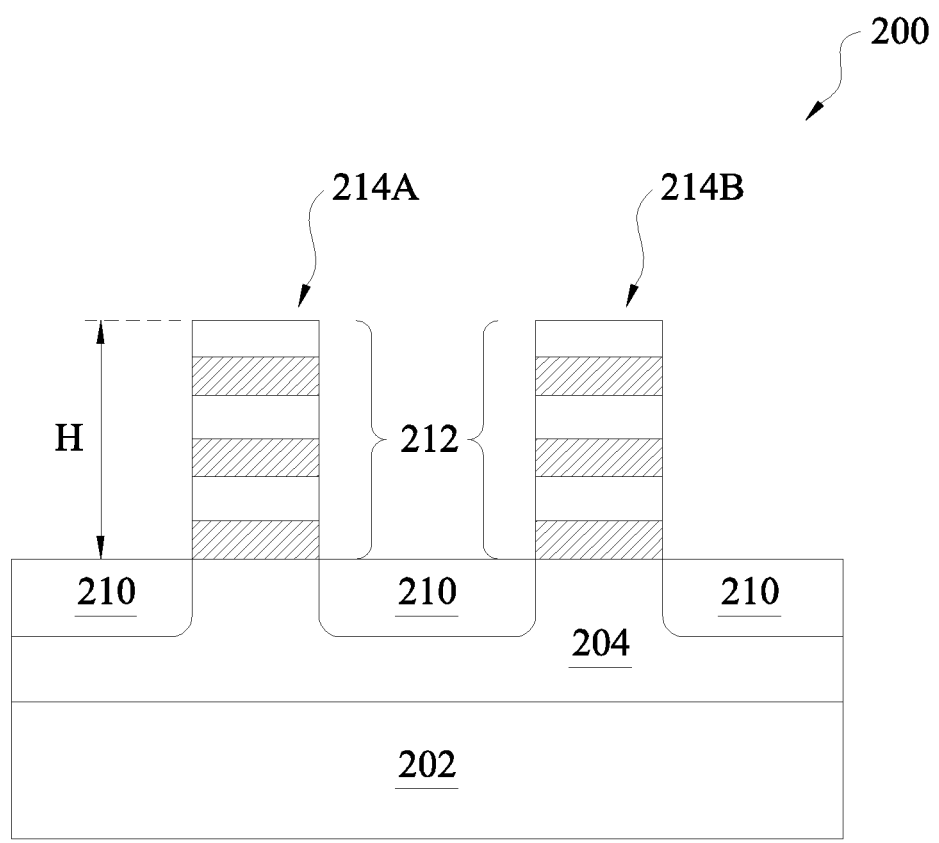

Referring to FIG. 1A and FIG. 2E, the method 100 proceeds to block 112, where the isolation features 210 are recessed. Referring to the example of FIG. 2E, the isolation features 210 interposing the fin elements 214A and 214B are recessed, thereby leaving the fin elements 214A and 214B extending above the isolation features 210. In some embodiments, the recessing process may include a dry etching process, a wet etching process, and/or a combination thereof. In some embodiments, a recessing depth is controlled (e.g., by controlling an etching time) so as to result in a desired height H of the exposed upper portion of the fin elements 214A and 214B. The height H may be chosen based on device performance considerations. In some embodiments, the height H is between about 8 nm and 300 nm.

Figure 3A:
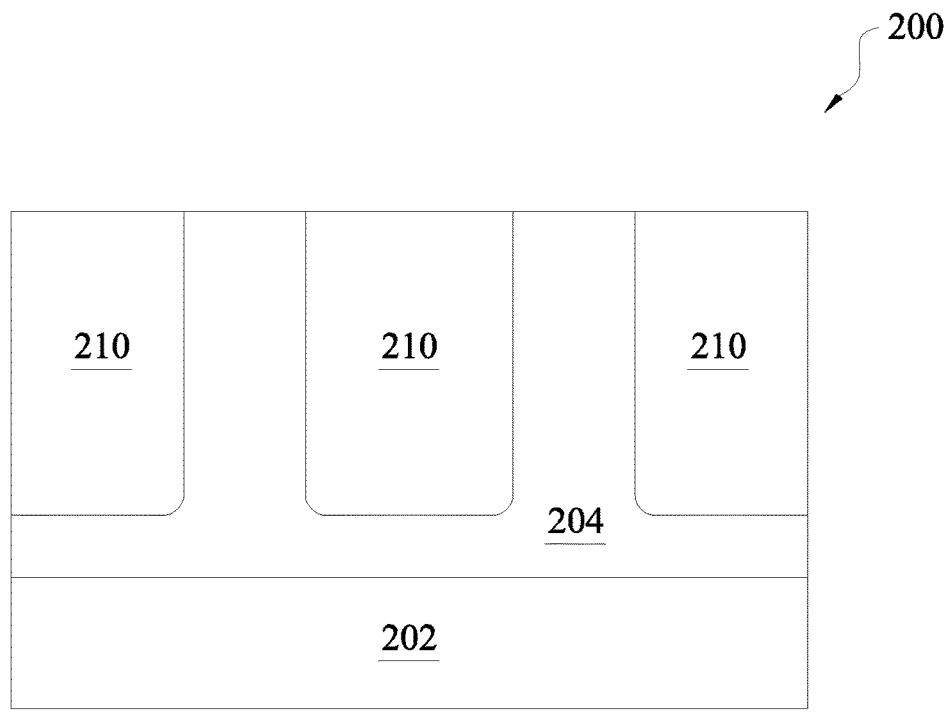
FIGS. 3A, 3B, 3C, and 3D are cross-sectional views of a portion of a semiconductor device according to an embodiment of the present disclosure.

Referring back to FIG. 1A, in another alternative embodiment of the method 100, after forming the SRB layer 204 over the substrate 202 at block 104, the method 100 proceeds to block 114, where isolation features are formed over the substrate. Referring to the example of FIG. 3A, isolation features 210 may be formed using suitable processes including photolithography, etch, and deposition processes, and a portion of the SRB layer 204 interposes the isolation features 210.

Figure 3B:
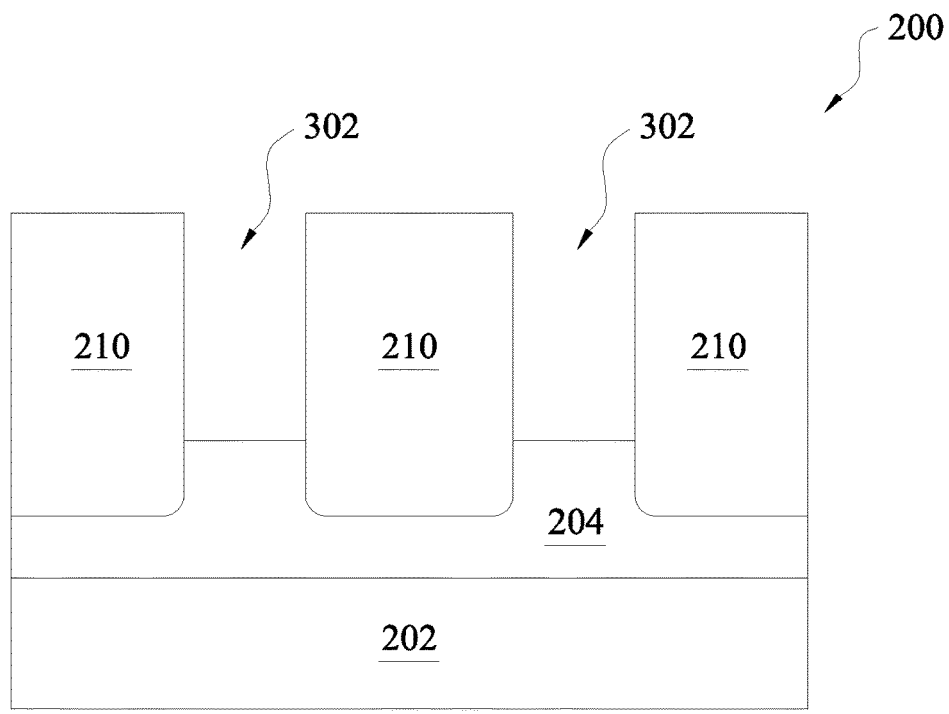

Referring to FIGS. 1A and 3B, the method 100 the proceeds to block 116, where trenches 302 between isolation features 210 are formed. Referring to the example of FIG. 3B, the portion of the SRB layer 204 interposing the isolation features 210 is at least partially etched to form trenches 302.

Figure 3C:
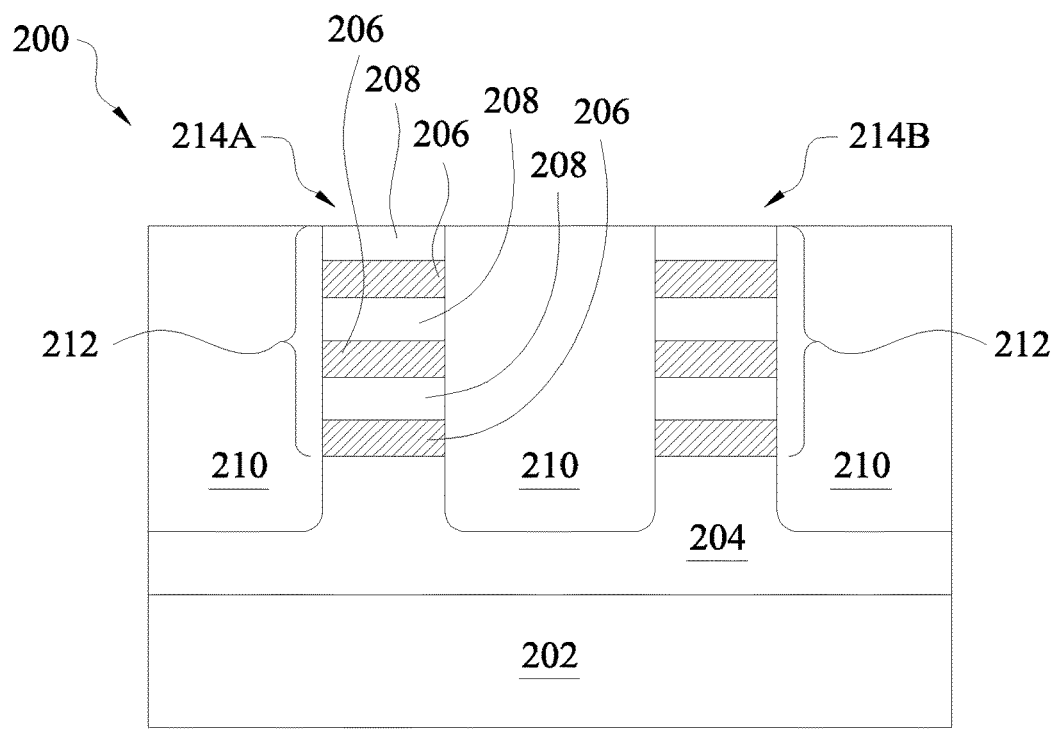

Referring to FIGS. 1A and 3C, the method 100 then proceeds to block 118, where stacks 212 including semiconductor layers 206 and 208 are formed in the trenches 302, and fin elements 214A and 214B are formed.

Figure 3D:
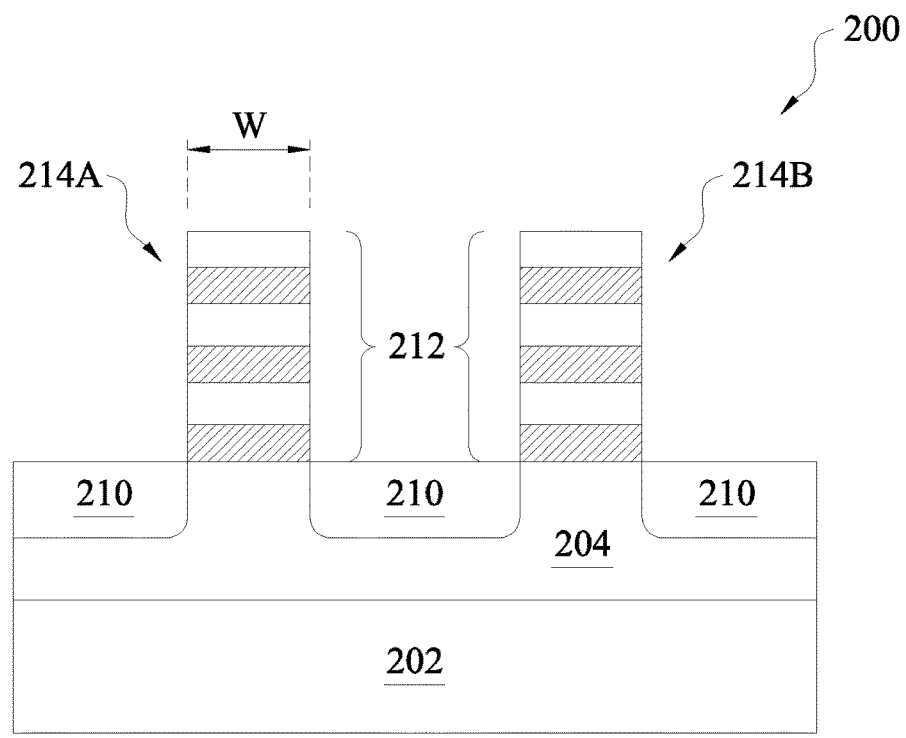

Referring to FIGS. 1A and 3D, the method 100 then proceeds to block 120, where the isolation features 210 are recessed to provide the fin elements 214A and 214B extending above a top surface of the isolation features 210.

Figure 4A:
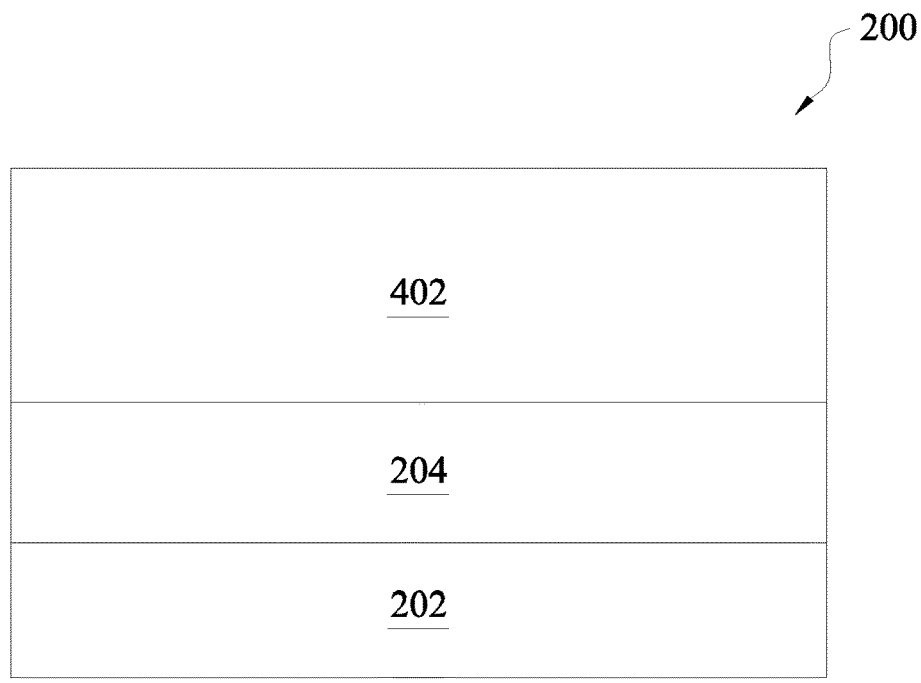
FIGS. 4A, 4B, 4C, 4D, 4E, and 4F are cross-sectional views of a portion of a semiconductor device according to an embodiment of the present disclosure.

Referring back to FIG. 1A, in yet another alternative embodiment of the method 100, after forming the SRB layer 204 over the substrate 202 at block 104, the method 100 proceeds to block 122, where a hard mask is formed over the substrate. Referring to the example of FIG. 4A, a hard mask 402 is formed over the SRB layer 204. In some embodiments, the hard mask 402 may include a dielectric such as a semiconductor oxide, a semiconductor nitride, and/or a semiconductor carbide.

Figure 4B:
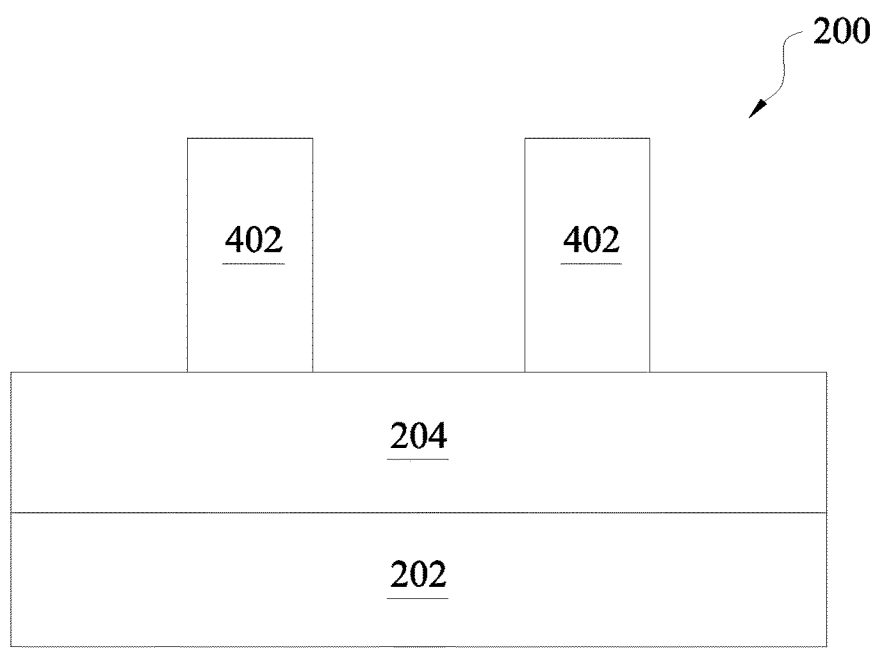
Figure 4C:
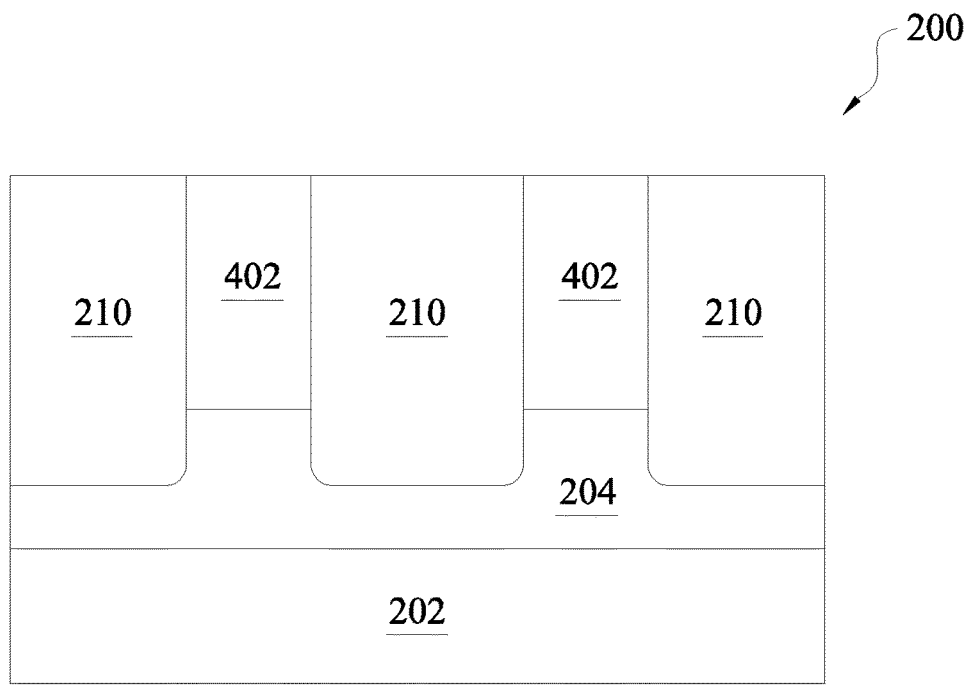
Figure 4D:
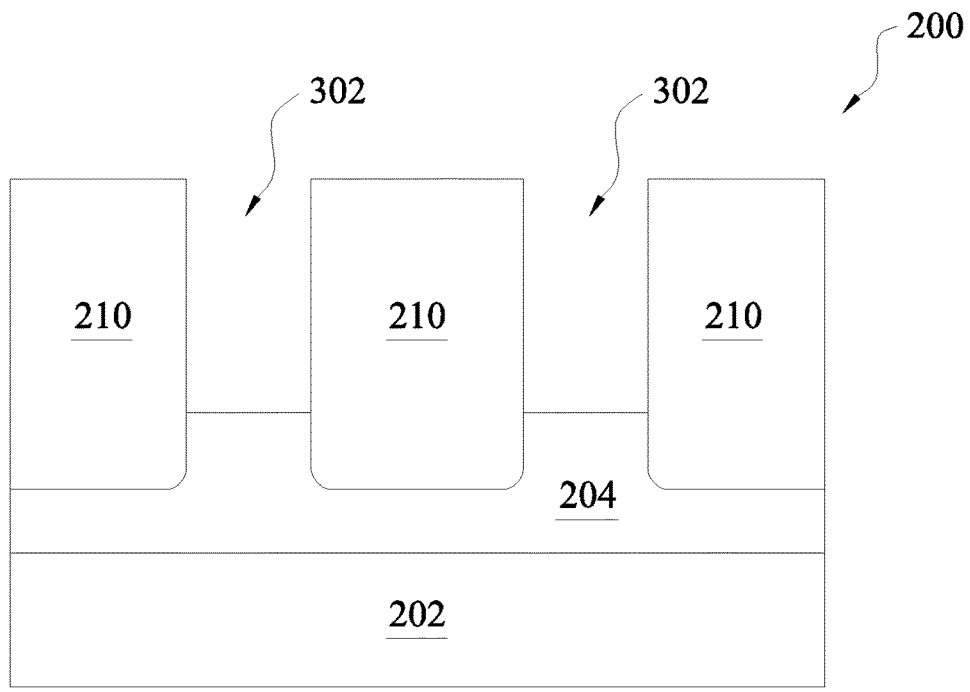
Figure 4E:
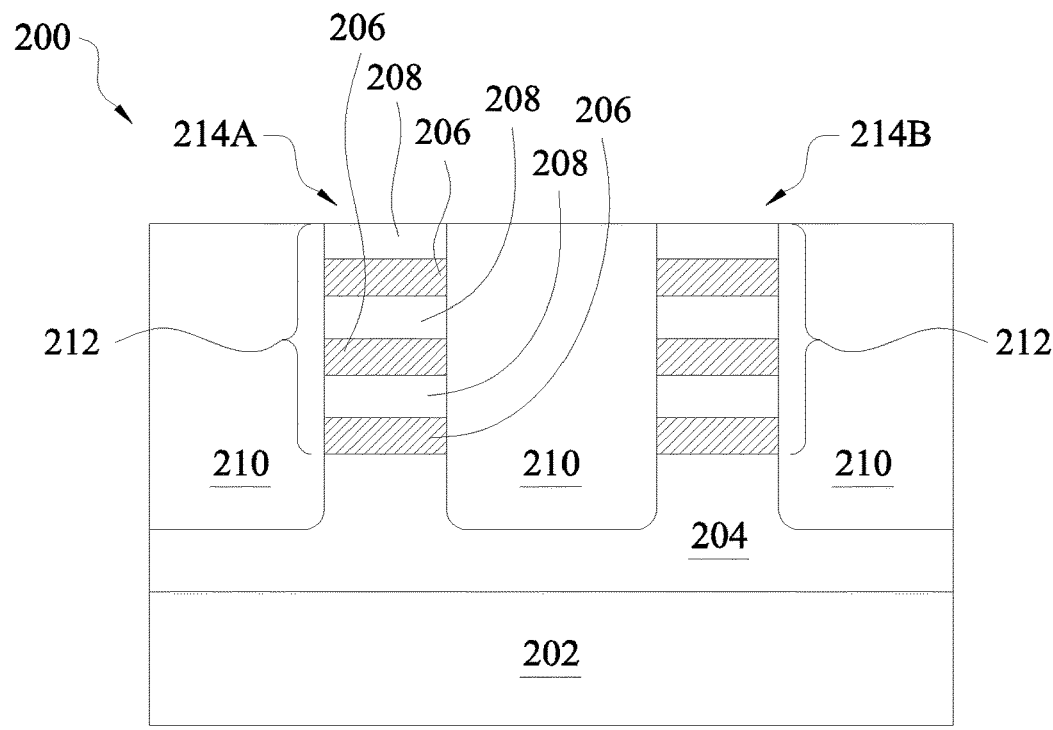
Figure 4F:
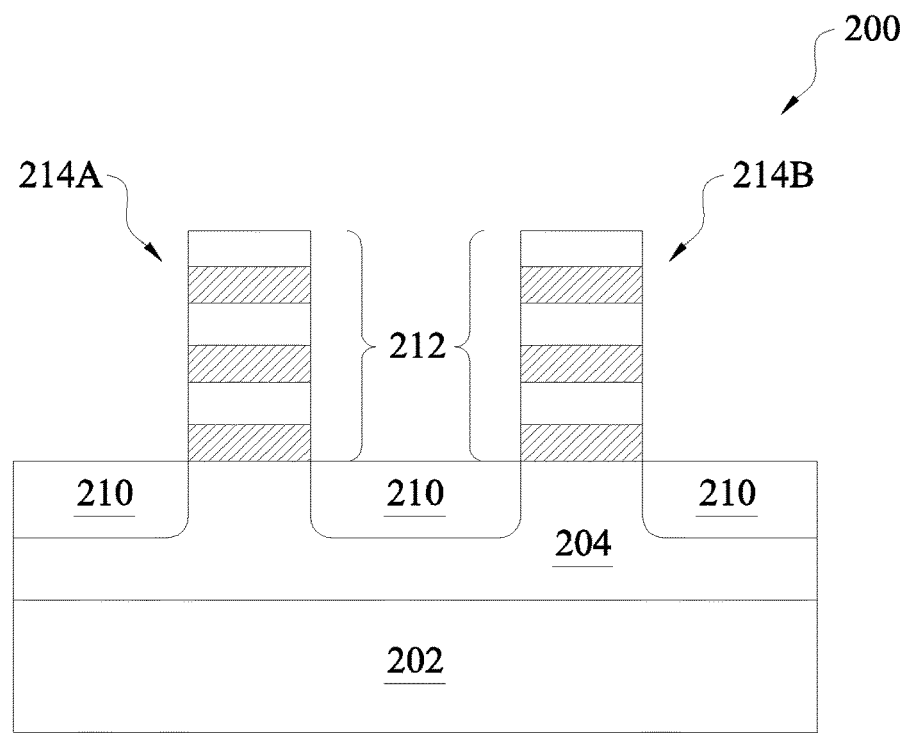

Referring to FIGS. 1A and 4B, the method 100 proceeds to block 124, where the hard mask 402 is patterned and etched. Referring to FIGS. 1A and 4C, the method 100 proceeds to block 126, where isolation features 210 are formed adjacent to the remaining portions of mask 402 using suitable processes including photolithography, etch, and deposition processes. Referring to FIGS. 1A and 4D, the method 100 proceeds to block 128, where an etch process may be used to remove the remaining portions of mask 402, thereby forming trenches 302 between isolation features 210. Referring to FIGS. 1A and 4E, the method 100 proceeds to block 130, where stacks 212 including semiconductor layers 206 and 208 are grown in the trenches 302 to form fin elements 214A and 214B. Referring to FIGS. 1A and 4F, the method 100 proceeds to block 132, where the isolation features 210 are recessed to provide the fin elements 214A and 214B extending above a top surface of the isolation features 210.

In some embodiments, forming the fin elements 214A and 214B may further include a trim process to decrease the width W and/or the height H of the fin elements 214A and 214B. The trim process may include wet or dry etching processes. The height H and width W of the fin elements 214A and 214B may be chosen based on device performance considerations.

Figure 1B:
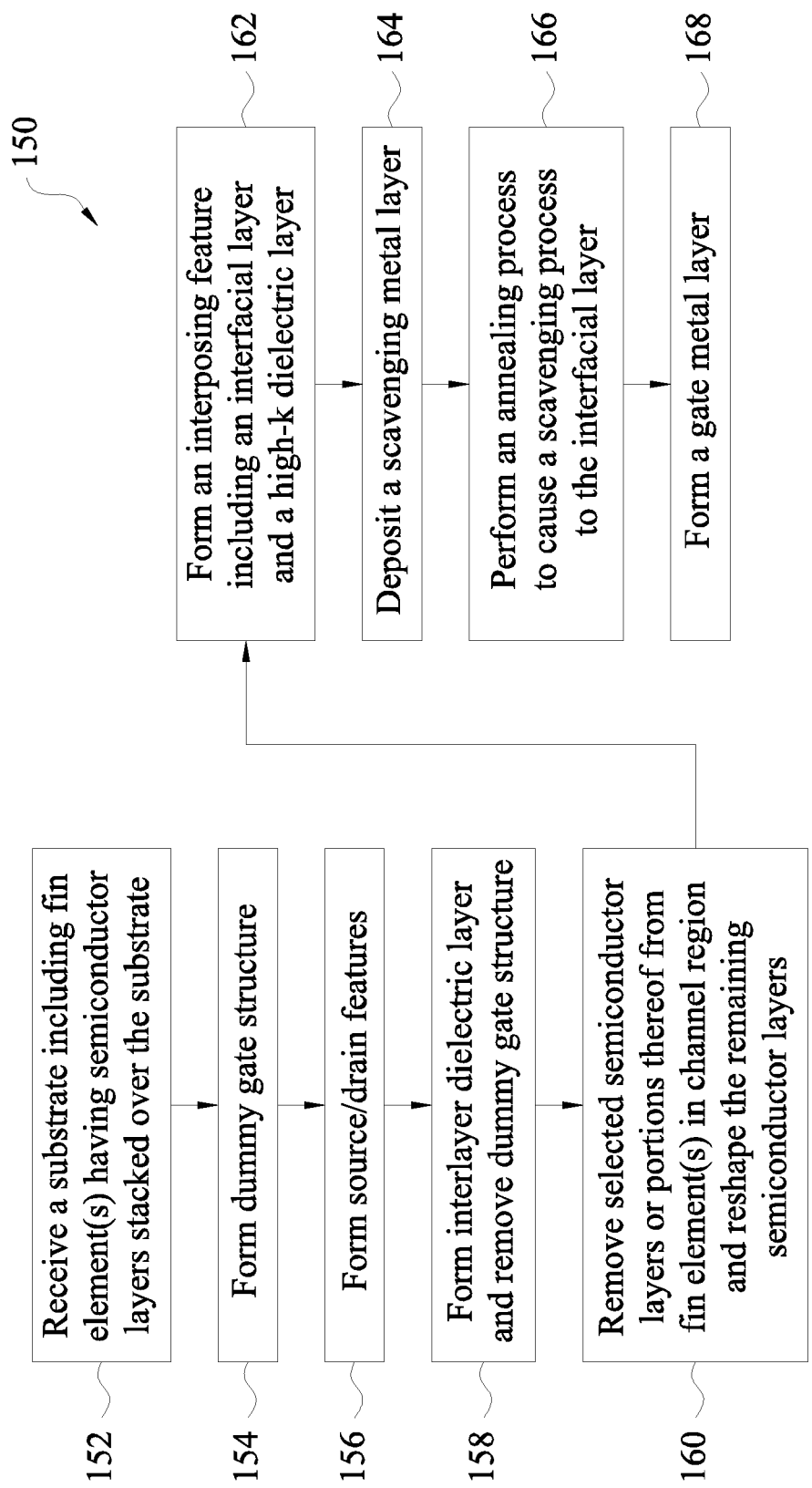

Referring now to FIG. 1B, illustrated is a method 150 of semiconductor fabrication for forming multi-gate devices. The method 150 begins at block 152, where a substrate includes fin elements including semiconductor layers stacked over the substrate is received. The fin elements may be formed by an embodiment of the method 100 described above or other suitable method known in the art. Referring to the example of FIGS. 5A and 5B, a substrate 202 including fin elements 214A and 214B including semiconductor layers 206 and 208 is provided. In some embodiments, the fin element 214A is a portion of N-type metal-oxide semiconductor (NMOS) elements, and fin element 214B is a portion of P-type metal-oxide semiconductor (PMOS) elements. As illustrated in FIG. 5B, the fin element 214A extends from a first region 500 (also referred to as an NMOS region) of the substrate 202, and the fin element 214B extends from a second region 501 (also referred to as a PMOS region) of the substrate 202.

Figure 5A:
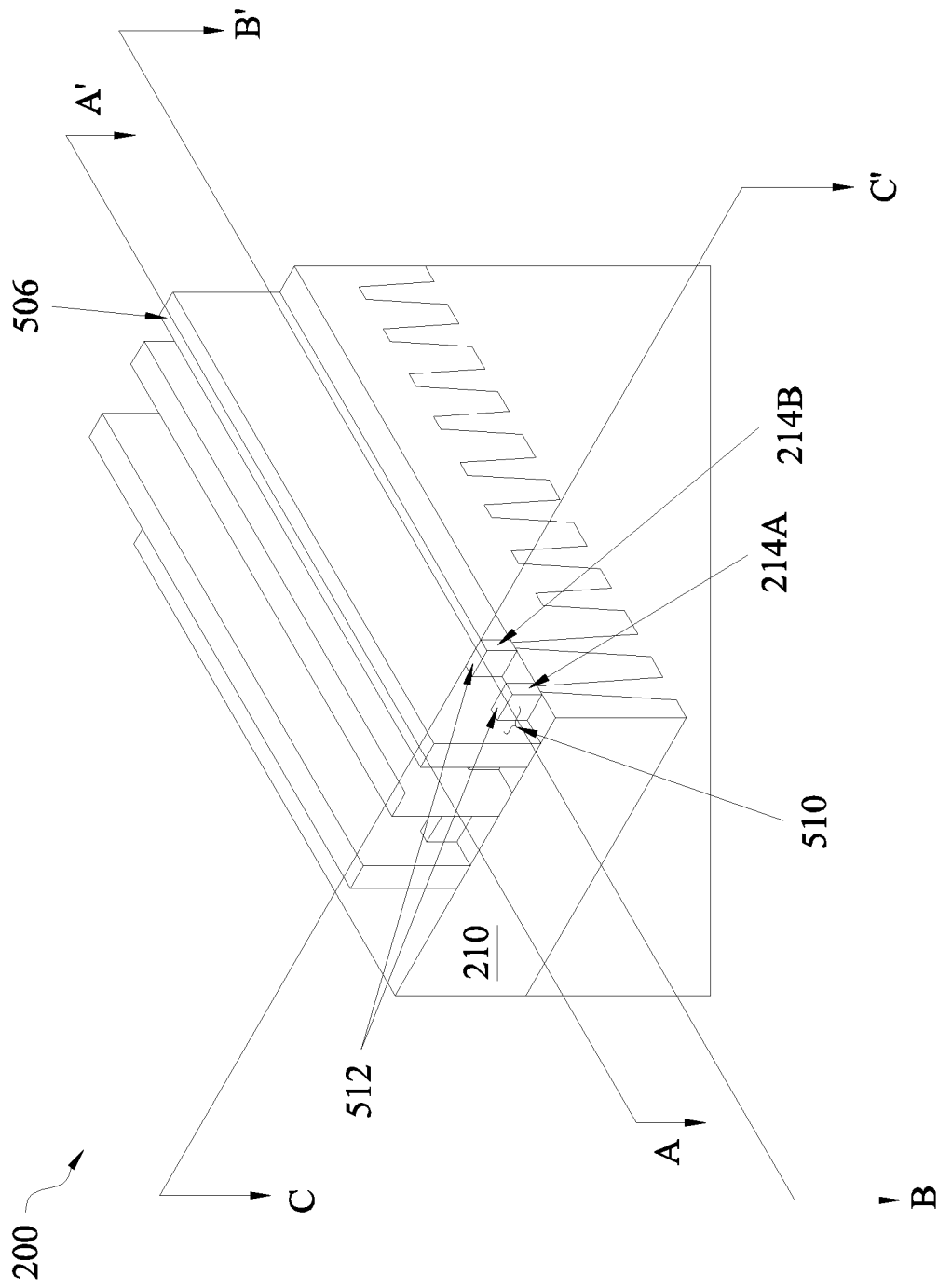
FIG. 5A is an isometric view of a portion of a semiconductor device according to an embodiment of the present disclosure.
Figure 5B:
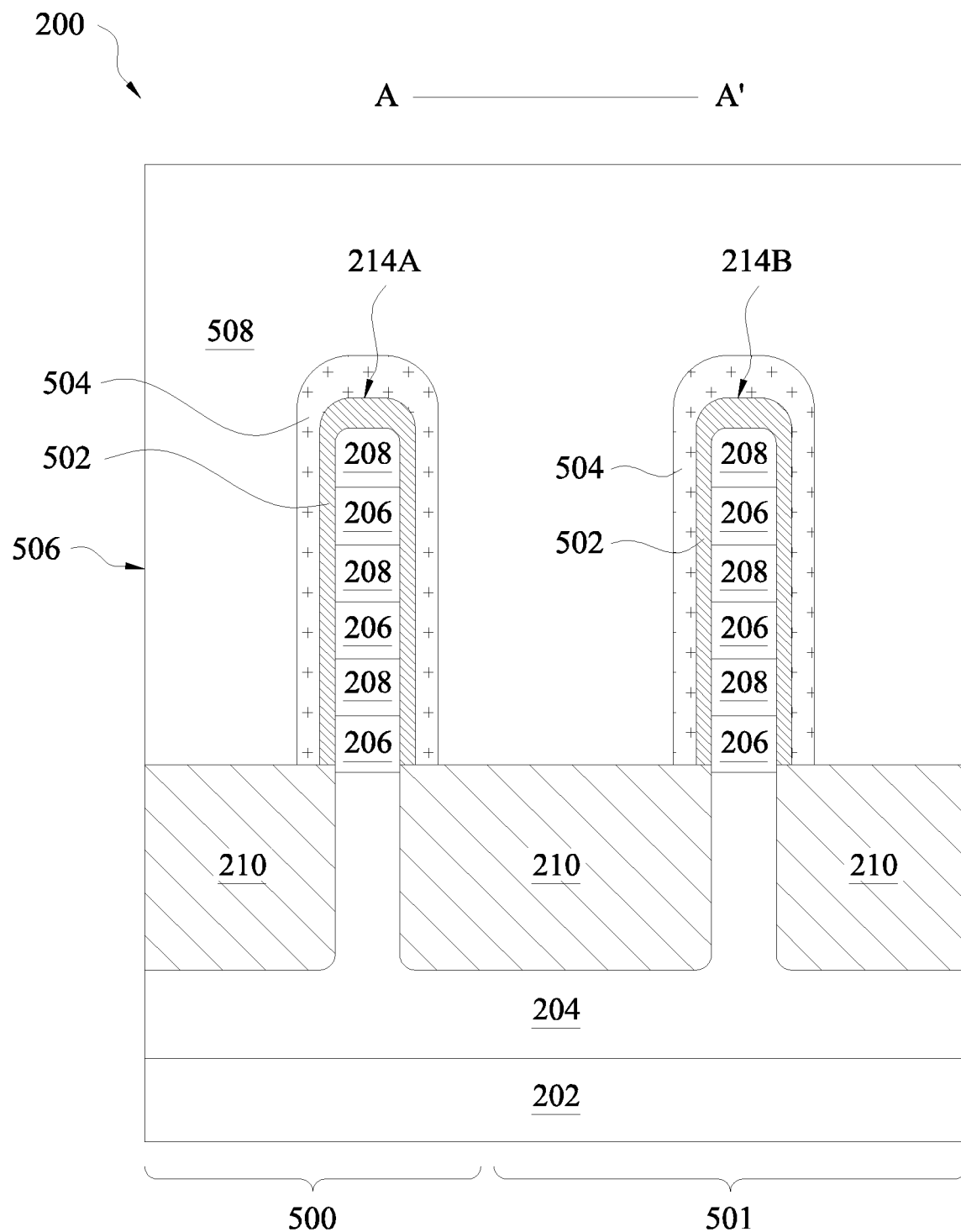
FIG. 5B is a cross-sectional view of a portion of a semiconductor device according to an embodiment of the present disclosure.

Referring now to FIGS. 1B, 5A, and 5B, the method 150 then proceeds to block 154 where dummy gate structures 506 are formed on the substrate 202. The dummy gate structure 506 may be replaced at a later processing stage by a high-K dielectric layer (HK) and metal gate electrode (MG) as discussed below. In some embodiments, the dummy gate structure 506 is formed over the substrate 202 and is at least partially disposed over the fin elements 214A and 214B. The portion of the fin elements 214A and 214B underlying the dummy gate structure 506 may be referred to as the channel region 512. The dummy gate structure 506 may also define a source/drain region 510 of the fin elements 214A, 214B, for example, as the portion of the fin elements 214A and 214B adjacent to and on opposing sides of the channel region 512.

Referring now to FIG. 5B, illustrated is a cross section of a portion of an embodiment of device 200 along the A-A' line of FIG. 5A. As illustrated in the example of FIG. 5B, the dummy gate structure 506 may include a capping layer 502 formed on the fin elements 214A, 214B. In some embodiments, the capping layer 502 may include $SiO_2$, silicon nitride, a high-K dielectric material or other suitable material. In various examples, the capping layer 502 may be deposited by a CVD process, a subatmospheric CVD (SACVD) process, a flowable CVD process, an ALD process, a PVD process, or other suitable process. By way of example, the capping layer 502 may be used to prevent damage to the fin elements 214A and 214B by subsequent processing (e.g., subsequent formation of the dummy gate structure). In some embodiments, the dummy gate structure 506 may include a dummy gate electrode layer 504 formed over the capping layer 502 on the fin elements 214A, 214B. In some examples, the dummy gate electrode layer 504 may include polycrystalline silicon (polysilicon). In some embodiments, the dummy gate structure 506 may include a dielectric layer 508 formed over the dummy gate electrode layer 504.

In some embodiments, the dummy gate structure 506 may be formed by various process steps such as layer deposition, patterning, etching, as well as other suitable processing steps. Exemplary layer deposition processes includes CVD (including both low-pressure CVD and plasma-enhanced CVD), PVD, ALD, thermal oxidation, e-beam evaporation, or other suitable deposition techniques, or combinations thereof. In forming the dummy gate structure 506 for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods.

In some embodiments, a gate spacer may be formed on sidewalls of the dummy gate structure 506. The gate spacer may include one or more dielectric materials such as silicon nitride, silicon oxide, silicon carbide, silicon oxycarbide (SiOC), silicon oxycarbon nitride (SiOCN), other materials, or a combination thereof. The spacer layer may include a single layer or a multi-layer structure. The spacer layer may be formed by chemical oxidation, thermal oxidation, ALD, CVD, and/or other suitable methods.

Figure 6:
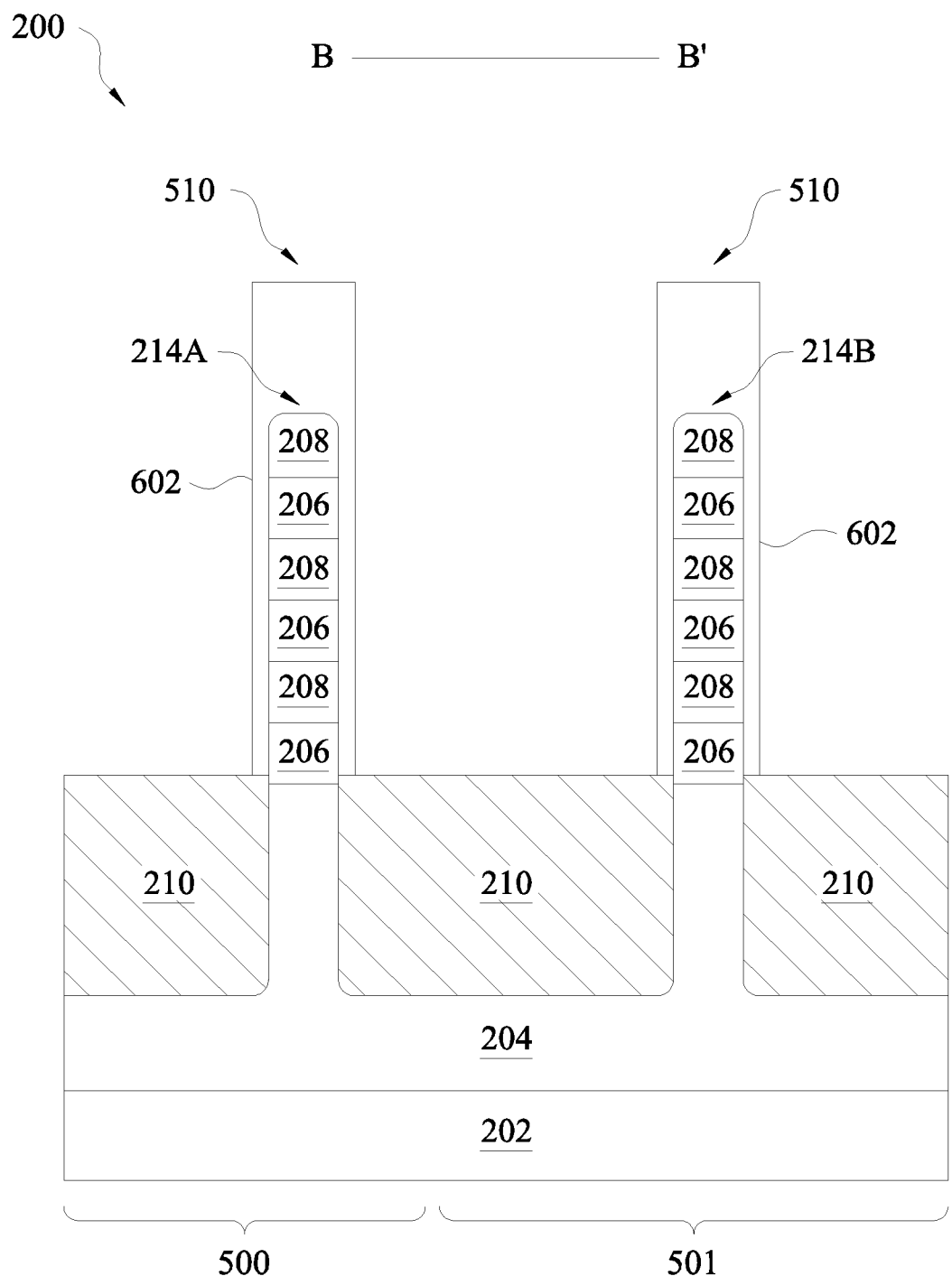
FIG. 6 is a cross-sectional view of a portion of a semiconductor device according to an embodiment of the present disclosure.

Referring now to FIGS. 1B and 6, the method 150 then proceeds to block 156 where source/drain features are formed. Referring now to FIG. 6, illustrated is a cross section of a portion of an embodiment of device 200 along the B-B' line of FIG. 5A in the source/drain region 510. The source/drawn features may be formed by performing an epitaxial growth process that provides an epitaxy material cladding the portions of the semiconductor layers 206 and/or 208 in the fin elements 214A and 214B's source/drain regions 510. In the example of FIG. 6, source/drain features 602 are formed over the substrate 202 on the fin elements 214A and 214B adjacent to and associated with the dummy gate structure 506.

In various embodiments, the source/drain features 602 may include Ge, Si, GaAs, AlGaAs, SiGe, GaAsP, SiP, or other suitable material. In some embodiments, source/drain features 602 may be in-situ doped during the epi process. For example, in some embodiments, the source/drain features 602 may be doped with boron. In some embodiments, the source/drain features 602 may be doped with carbon to form Si:C source/drain features, phosphorous to form Si:P source/drain features, or both carbon and phosphorous to form SiCP source/drain features. In some embodiments, the source/drain features 602 are not in-situ doped, and instead an implantation process is performed to dope the source/drain features 602.

Figure 7A:
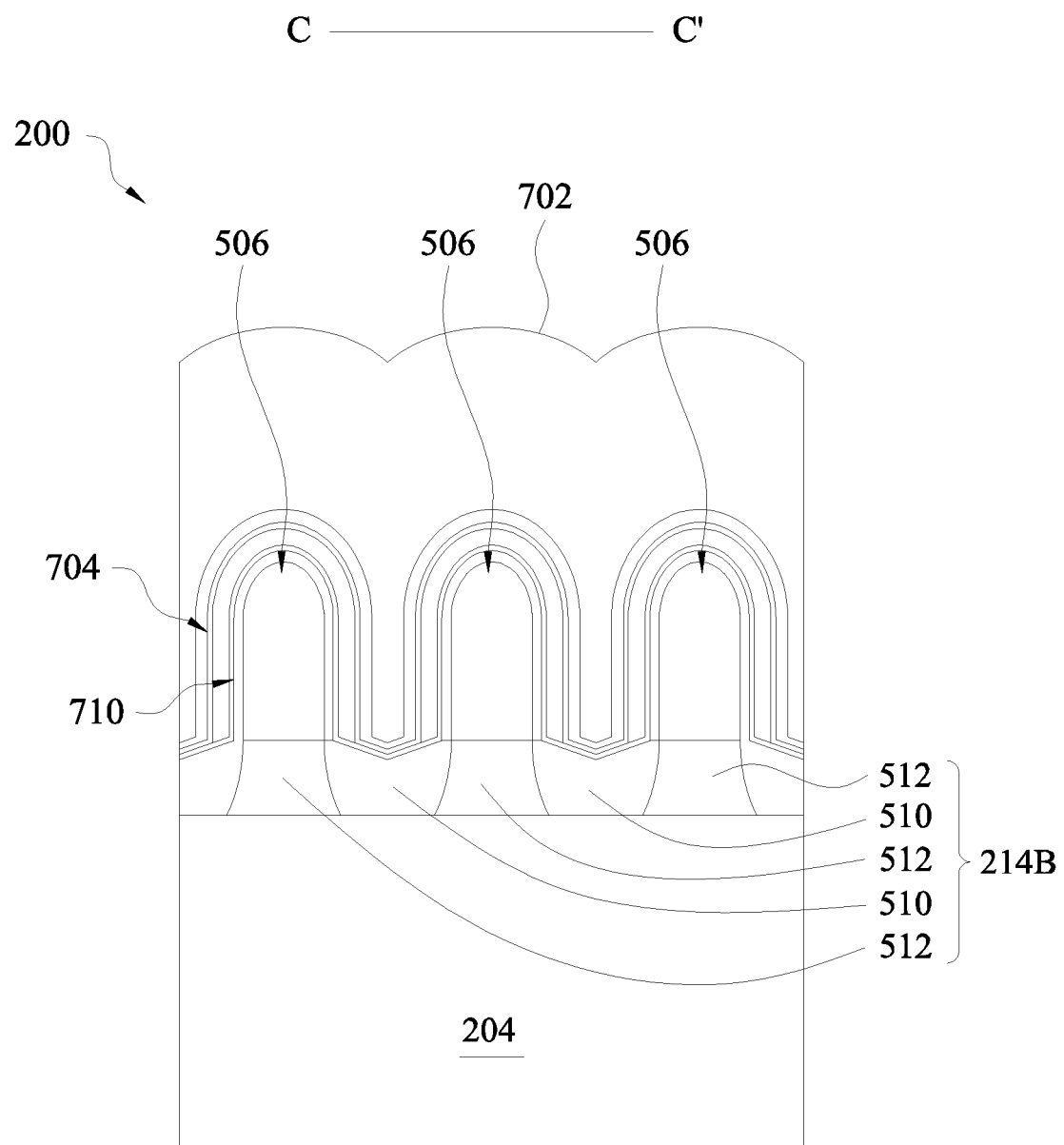
FIGS. 7A, 7B, 7C, 7D, and 7E are cross-sectional views of a portion of a semiconductor device according to an embodiment of the present disclosure.

In some embodiments, at block 156, after forming the source/drain features, an etch-stop layer (e.g., a contact etch stop layer (CESL) 704) and various dielectric layers (e.g., an inter-layer dielectric (ILD) layer 702) are formed on the substrate 202. Referring to FIG. 7A, illustrated is a cross section of a portion of an embodiment of device 200 along the C-C' line (along the fin element 214B) of FIG. 5A. In some embodiments, a CESL 704 is formed over the gate spacer 710 and dummy gate structure 506. In some examples, the CESL 704 includes a silicon nitride layer, silicon carbon nitride layer, a silicon oxynitride layer, and/or other materials known in the art. The CESL 704 may be formed by ALD, PECVD, or other suitable deposition or oxidation processes. An inter-layer dielectric (ILD) layer 702 may be formed over the CESL 704. In some embodiments, the ILD layer 702 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 702 may formed by a PECVD process, a flowable CVD (FCVD) process, or other suitable deposition technique.

Figure 7B:
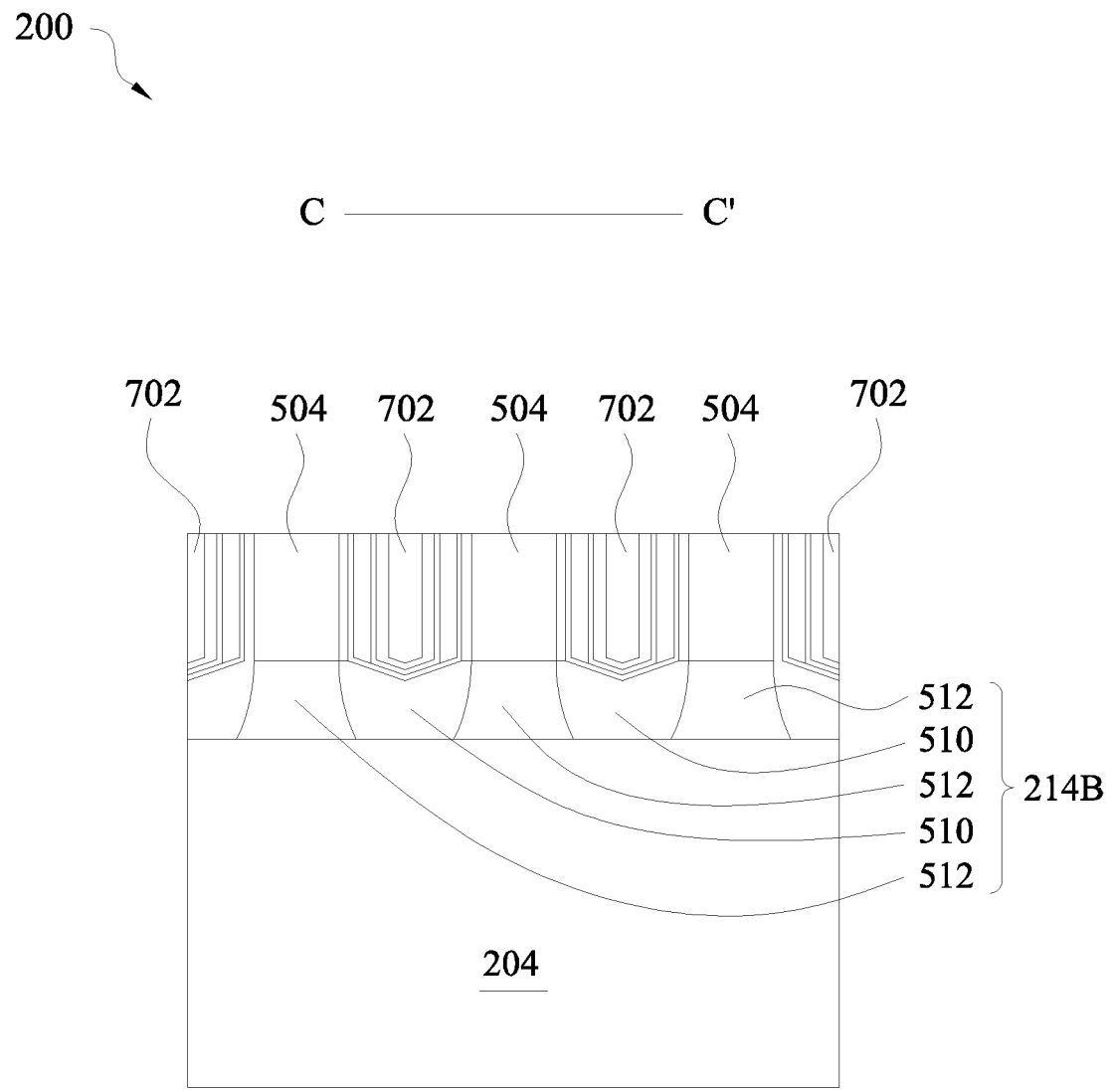

Referring to the example of FIG. 7B, in an embodiment, after the CESL 704 and the ILD layer 702 are deposited, a planarization process, such as a chemical mechanical planarization (CMP) process, may be performed to expose a top surface of the dummy gate structure 506. The CMP process may remove portions of the ILD layer 702 and CESL 704 overlying the dummy gate structure 506 and may planarize a top surface of the device 200. In addition, the CMP process may remove portions of the dummy gate structure 506 to expose the dummy gate electrode layer 504.

Figure 7C:
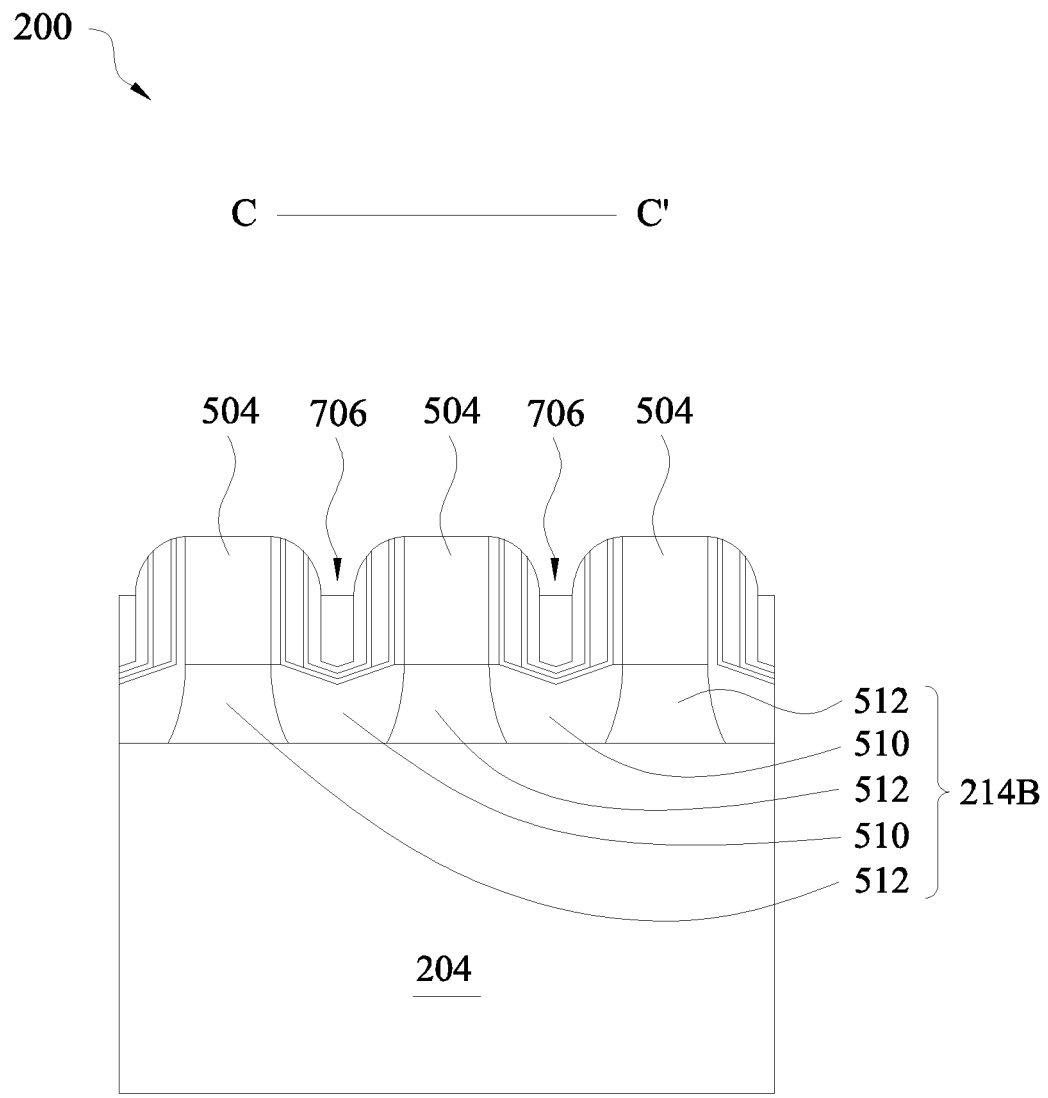
Figure 7D:
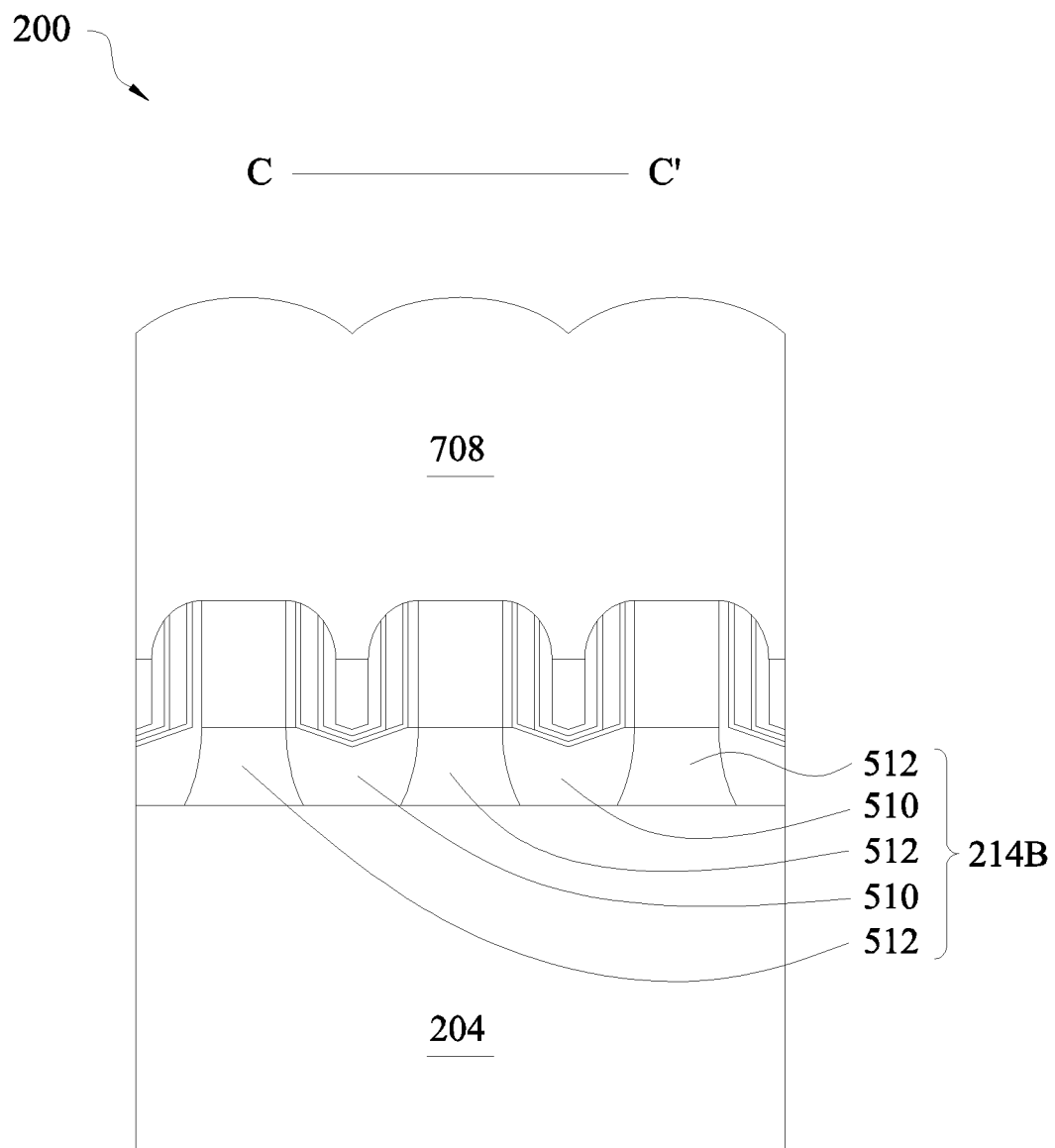

Referring to the example of FIG. 7C, in some embodiments, an etch process may be performed to the ILD layer 702 to remove a top portion of the ILD layer 702, thereby forming openings 706 on top of the ILD layer 702. Referring to the example of FIG. 7D, a dielectric material (e.g., silicon nitride) may be deposited over the substrate 202 to fill the openings 706, thereby forming a dielectric layer 708.

Figure 7E:
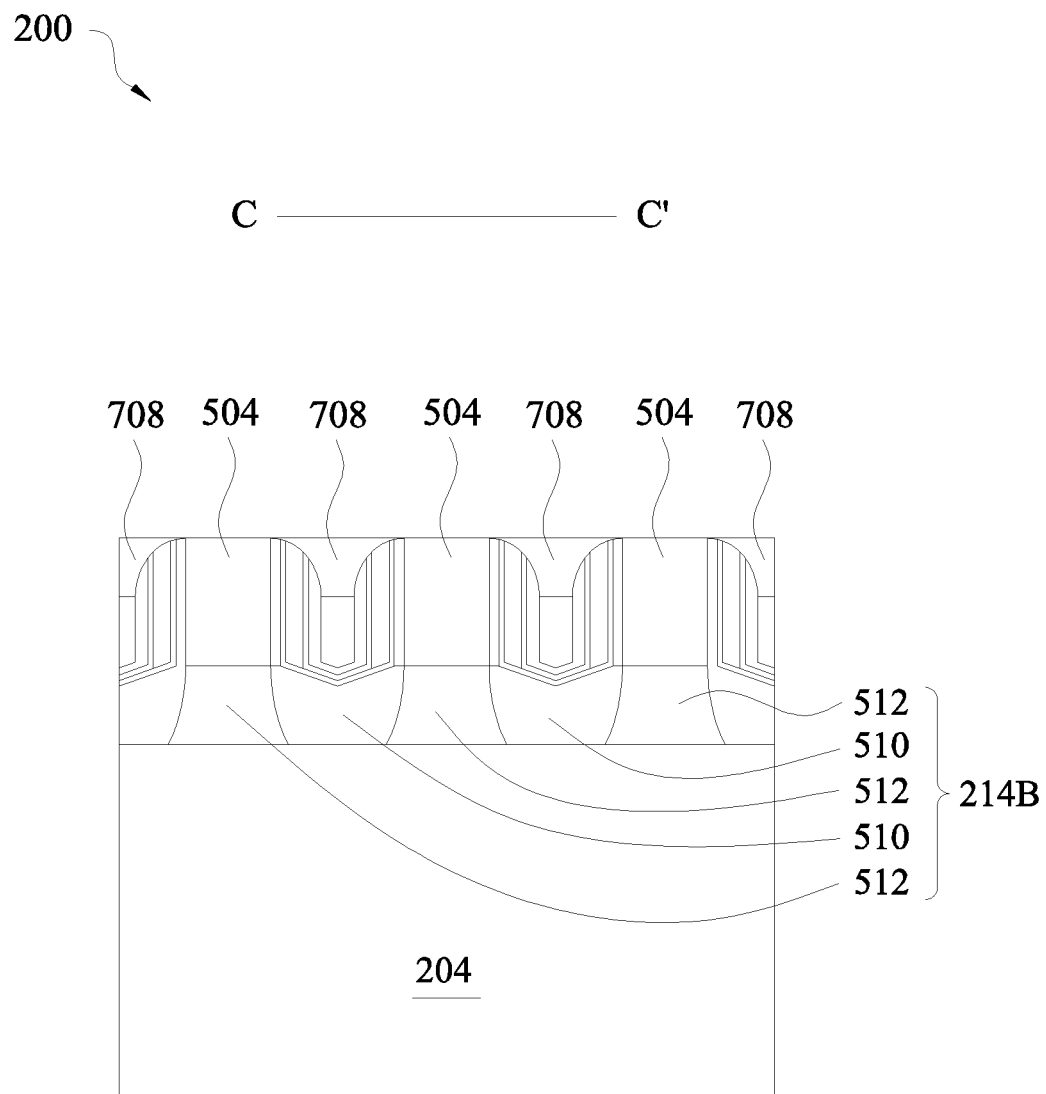
Figure 7F:
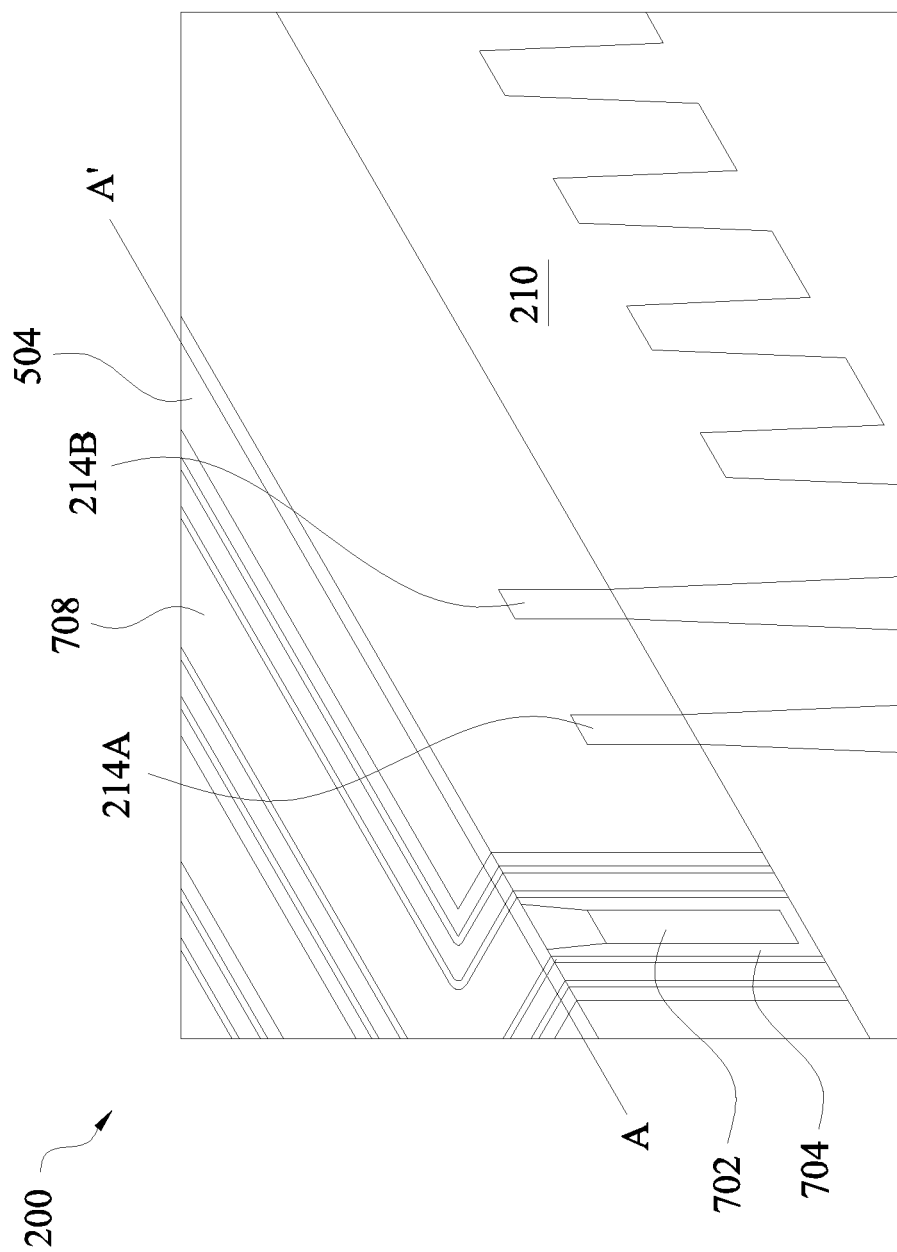
FIG. 7F is an isometric view of a portion of a semiconductor device according to an embodiment of the present disclosure.

Referring to the example of FIGS. 7E and 7F, illustrated are a cross-sectional view and an isometric view of the device 200 after a CMP process is performed to planarize a top surface of the device 200 respectively. In some embodiments, the CMP process may remove portions of the dielectric layer 708 to expose the dummy gate electrode layer 504 from a top surface of the device 200.

Figure 8A:
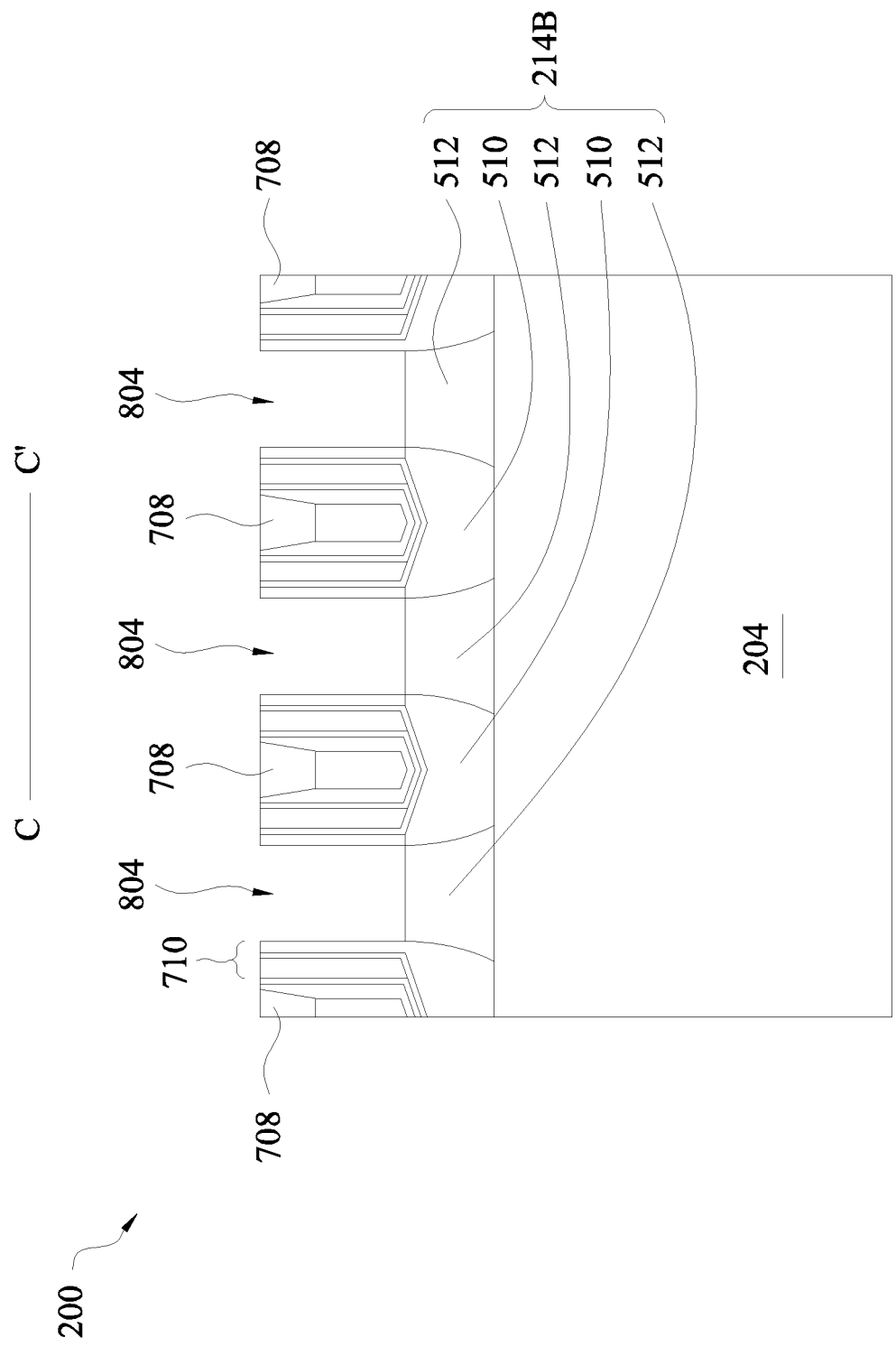
FIG. 8A is a cross-sectional view of a portion of a semiconductor device according to an embodiment of the present disclosure.
Figure 8B:
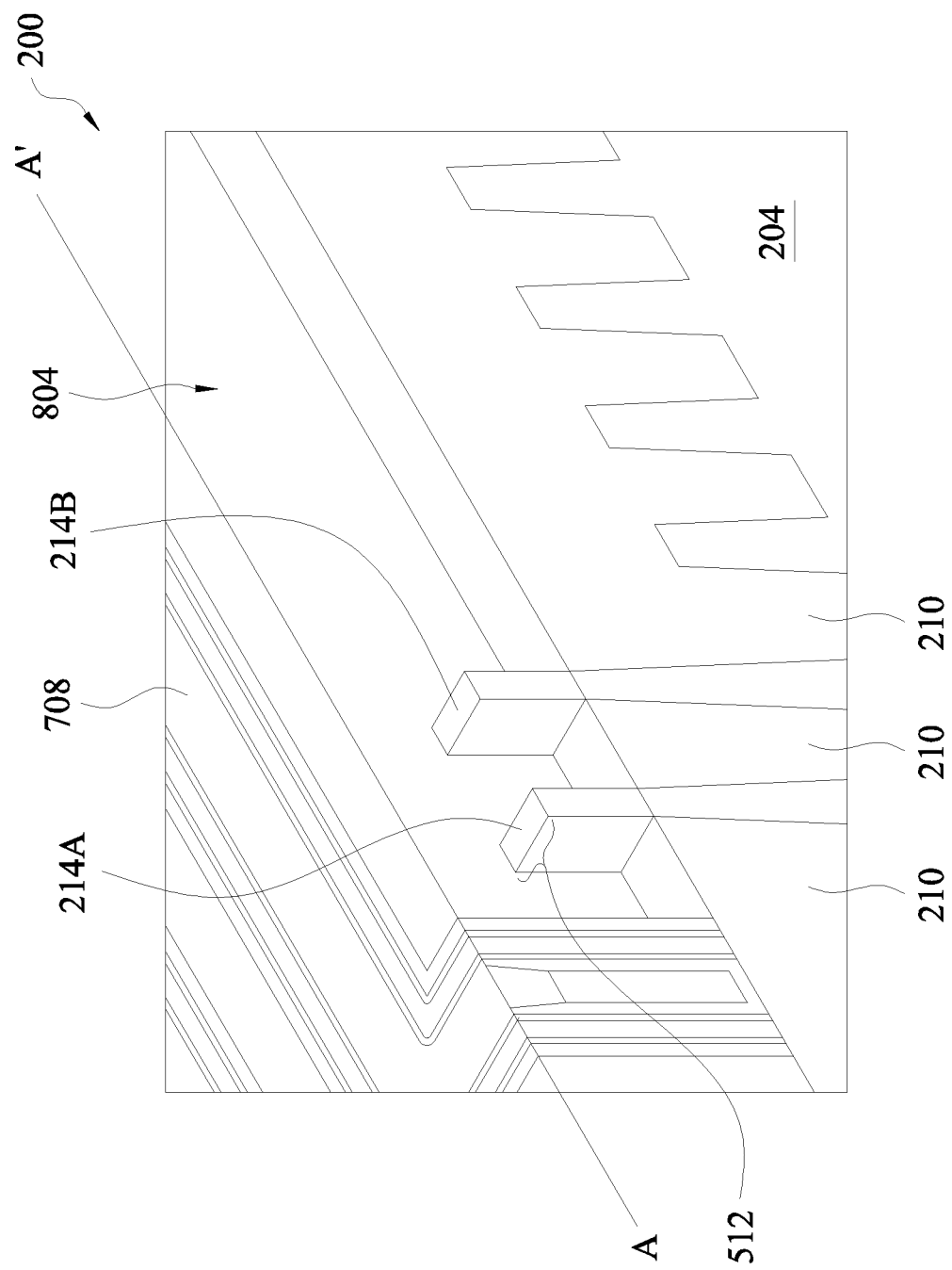
FIG. 8B is an isometric view of a portion of a semiconductor device according to an embodiment of the present disclosure.

Referring now to FIGS. 1B, 8A, and 8B, the method 150 then proceeds to block 158 where the dummy gate structure 506 is removed to expose the channel regions of the fin elements. Referring to FIGS. 8A and 8B, the removal of the dummy gate structure 506 forms an opening 804 that exposes the channel regions 512 of the fin elements 214A and 214B. In an embodiment, block 158 includes one or more etching processes, such as wet etching, dry etching, or other etching techniques.

Figure 9A:
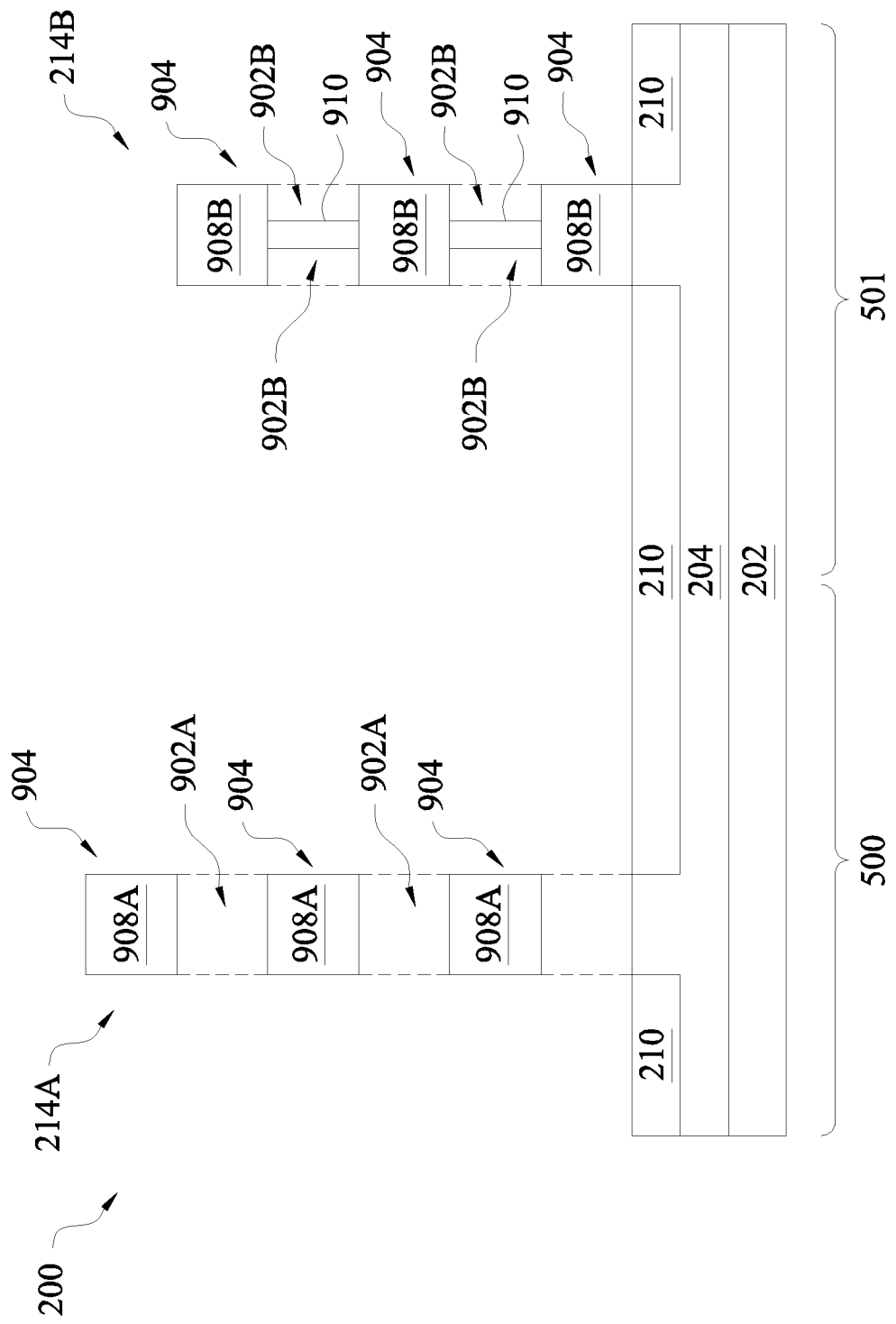
FIGS. 9A, 9B, and 9C are cross-sectional views of a portion of a semiconductor device according to an embodiment of the present disclosure.

Referring to FIGS. 1B and 9A, the method then proceeds to block 160 where portions of selected semiconductor layers in the channel regions are removed through the opening 804. Block 160 may include a first removal process to remove selected semiconductor layers (e.g., semiconductor layers 206) in the NMOS region 500 and a second removal process to remove selected semiconductor layers (e.g., semiconductor layers 208) in the PMOS region 501.

In some embodiments, the first removal process includes forming a first patterned resist layer by a lithography process over the substrate 202. The first patterned resist layer may include an opening exposing the NMOS region 500 while protecting the PMOS region 501. The first removal process may include a first etching process performed in the NMOS region 500 through the opening of the patterned resist layer. In the example of FIG. 9A, in the NMOS region 500, semiconductor layers 206 of the fin element 214A in the channel region 512 are completely removed. The semiconductor layers 208 of the fin element 214A remain substantially un-etched. In the following discussion, the portions of the semiconductor layers 208 of the fin elements 214A in the channel regions are referred to as the channel layers 908A. In the example of FIG. 9A, the channel layers 908A have a channel cross-sectional profile 904 of a square and are suspended in the opening 804. Gaps 902A are formed between adjacent semiconductor layers 208. In some embodiments, the first etching process includes a selective wet etching process, and may include a hydro fluoride (HF) etchant. After the first etching process is completed, the first patterned resist layer is removed.

In some embodiments, the second removal process includes forming a second patterned resist layer by a lithography process over the substrate 202. The second patterned resist layer may include an opening exposing the PMOS region 501 while protecting the NMOS region 500. The second removal process may include a second etching process performed in the PMOS region 501 through the opening of the second patterned resist layer. As illustrated in the example of FIG. 9A, in the PMOS region 501, semiconductor layers 208 of the fin element 214B in the channel region 512 are partially removed to form supporting layers 910, which support semiconductor layers 206 in the channel region 512 (referred to as the channel layers 908B hereafter). In the example of FIG. 9A, channel layers 908B have a channel cross-sectional profile 904 of a square. Adjacent channel layers 908B may be separated by a supporting layer 910 and gaps 902B formed along opposing sidewalls of the supporting layer 910. In some embodiments, a bottom surface of a channel layer 908B of the fin element 214B is substantially coplanar with a top surface of the SRB layer 204. In some embodiments, the second etching process includes a selective wet etching process, and may include a hydro fluoride (HF) etchant. After the second etching process is completed, the second patterned resist layer is removed.

Alternatively, in some embodiments, in the PMOS region 501, the semiconductor layers 206 of the fin element 214B in the channel region 512 are partially removed to form supporting layers 910, and the semiconductor layers 208 of the fin element 214B in the channel region 512 form channel layers 908B. In some examples, a bottom surface of a supporting layer 910 is substantially coplanar with a top surface of SRB layer 204.

In some embodiments, in the PMOS region 501, the supporting layers 910 are oxidized for isolation purposes. To further this embodiment, the oxidation process may include a wet oxidation process, a dry oxidation process, or a combination thereof. In one example, the device 200 is exposed to a wet oxidation process using water vapor or steam as the oxidant. In one example where the supporting layers 910 include SiGe, the oxidized supporting layers 910 include silicon germanium oxide.

Figure 9B:
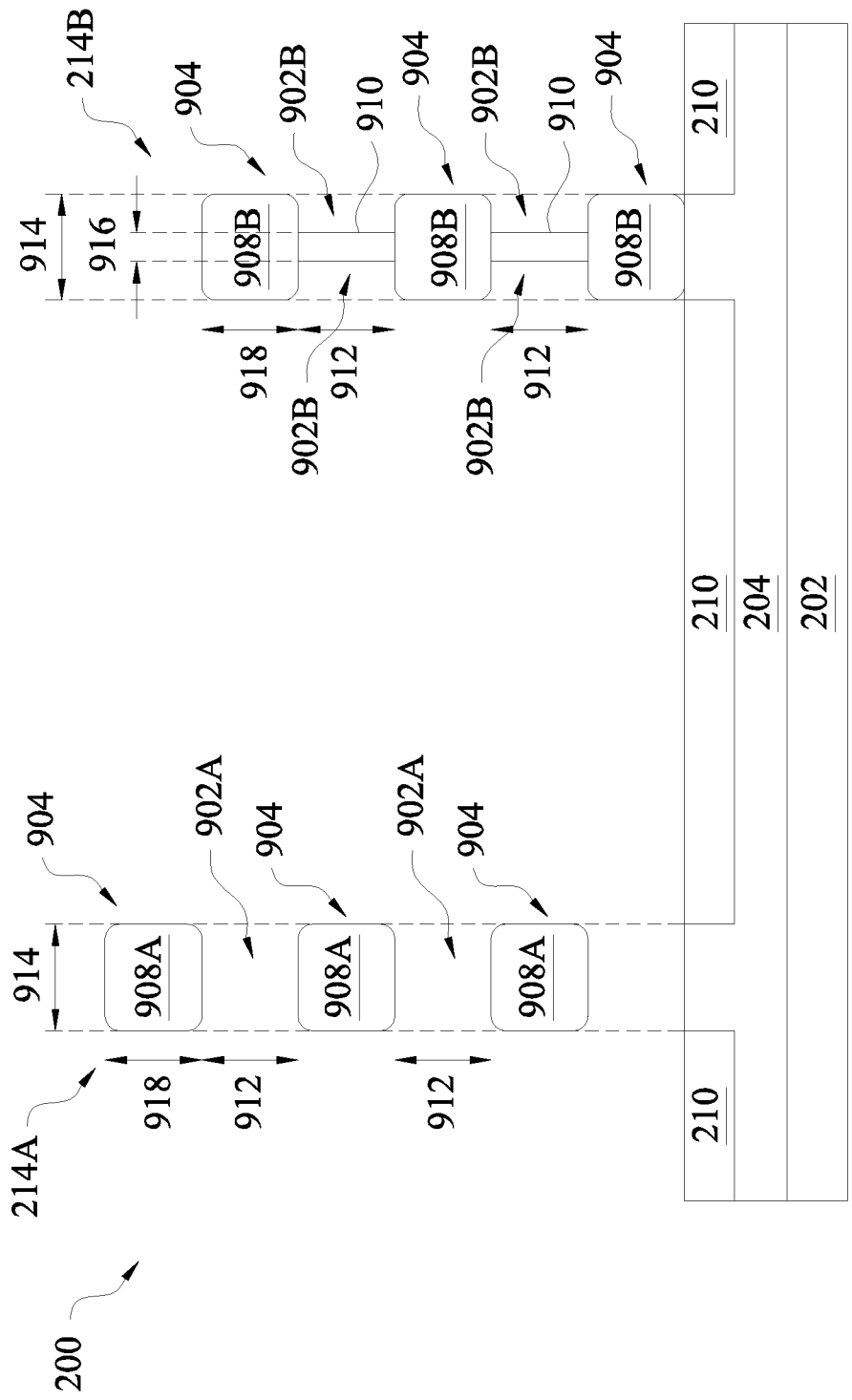

Referring now to FIG. 9B, in some embodiments, channel layers 908A, 908B and/or supporting layers 910 are slightly etched to obtain various desirable dimensions and shapes in the channel region 512 by one or more selective wet etching processes. In some examples, the selective wet etching process may be the same as the first and/or second wet etching process used to remove selected semiconductor layers the NMOS region 500 and PMOS region 501, or may include a separate etching process. In some embodiments, the etching conditions may be controlled so that the channel layers 908A and 908B may have channel cross-sectional profiles of particular shapes, e.g., a rounded square, a circle, a diamond, an oval, or another geometrical shape. In the example of FIG. 9B, the channel layers 908A and 908B have a profile 904 of the same shape (e.g., a rounded square). Alternatively, in some examples, the channel layers 908A and 908B may have profiles of different shapes. In some embodiments, the etching conditions of the etching process may be controlled so that the channel layers 908A, 908B have desired channel layer widths 914 and desired channel layer heights 918, the supporting layers 910 have desired supporting layer widths 916, and adjacent channel layers 908A, 908B have desired spacing distances 912. The various desired dimensions and shapes may be chosen based on device performance considerations.

Figure 9C:
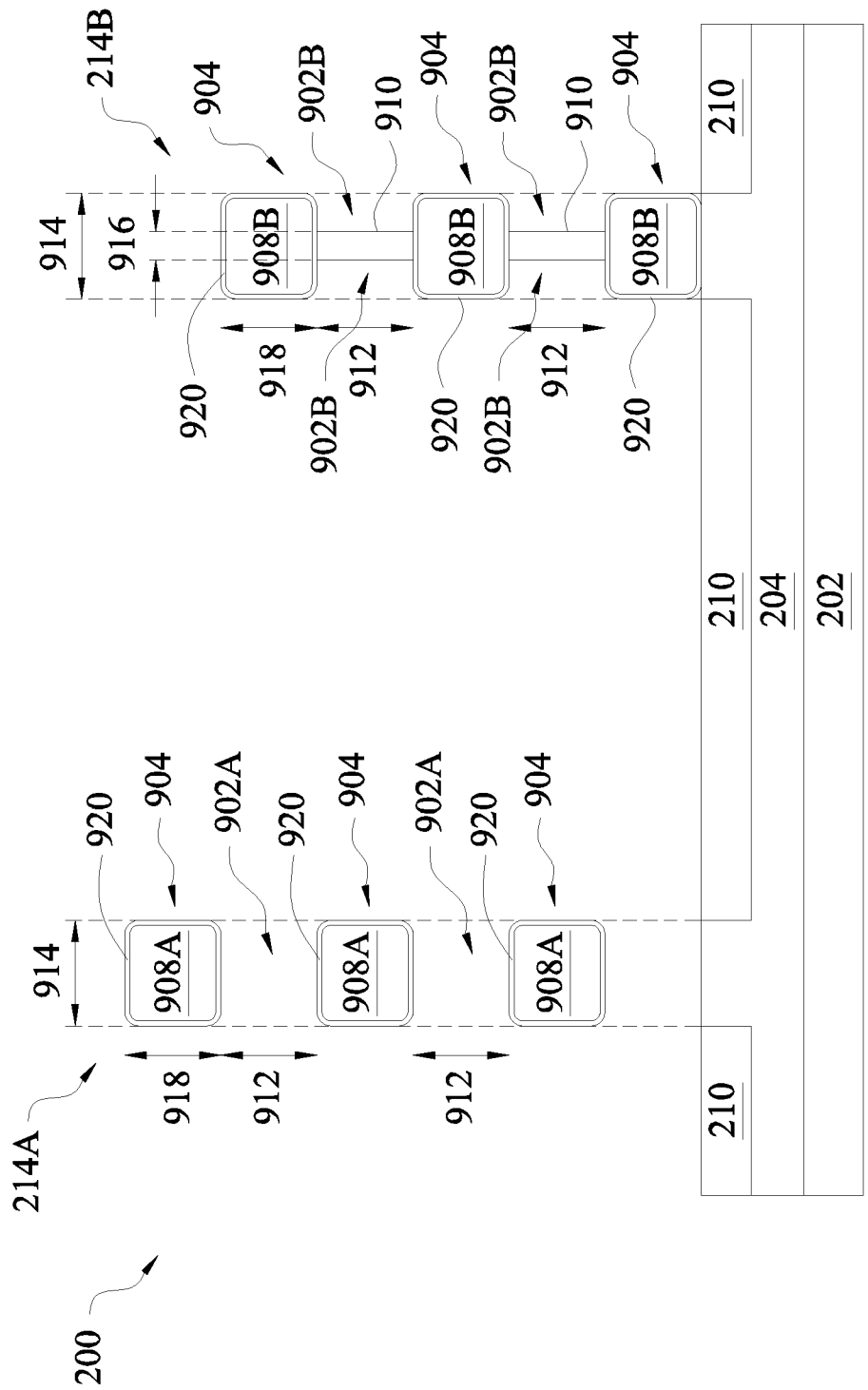

Referring now to FIG. 9C, in some embodiments, a capping layer 920 including silicon may be grown around the channel layers 908A or 908B (e.g., when channel layers 908A or 908B have a Ge concentration in the range of about 30 atomic percent to about 100 atomic percent). The capping layer 920 may become a part of the channel layer 908A or 908B, and may affect the channel layer widths 914, channel layer heights 918, spacing distances 912, and profile 904. In some examples, the capping layer 920 has a thickness of about 0.5 nm to about 2 nm. By way of example, growth of the capping layer 920 may be performed by an MBE process, an MOCVD process, and/or other suitable epitaxial growth processes.

Referring to FIGS. 1B, 10A, 10B, and 10C, the method 150 proceeds to block 112, where an interposing feature 1024 is formed in the channel regions of the fin elements. Referring to the examples of FIGS. 10A, 10B, and 10C, in various embodiments, spacing distances 912 between adjacent channel layers 908A or 908B may affect the configurations of the interposing feature 1024 (e.g., portions of the interposing feature 1024 disposed in the gaps 902A and 902B).

Figure 10A:
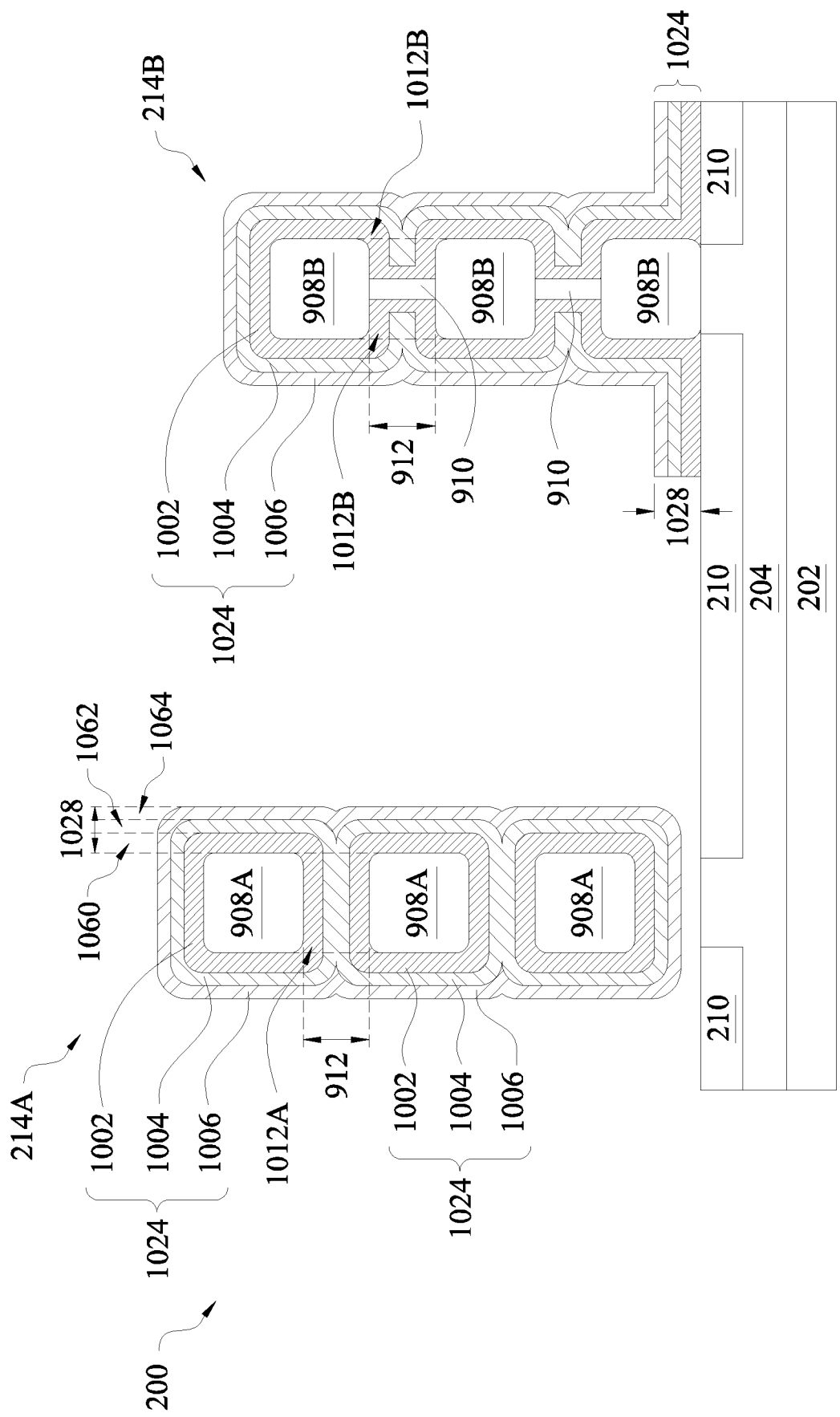
FIGS. 10A, 10B, and 10C are cross-sectional views of a portion of a semiconductor device according to various embodiments of the present disclosure.

Referring now to the example of FIG. 10A, an interposing feature 1024 is formed over the substrate 202 in the channel regions 512. Portions of the interposing feature 1024 completely fill the gaps 902A, 902B to form spacing areas 1012A, 1012B.

In some embodiments, the interposing feature 1024 includes at least one interfacial layer 1002 disposed in the channel regions 512. In some embodiments, the interfacial layer 1002 has a thickness 1060 less than or equal to about 1.5 nm. In some embodiments, the interfacial layer 1002 has a thickness 1060 less than or equal to about 0.6 nm. In the example of FIG. 10A, an interfacial layer 1002 completely wraps around a channel layer 908A of the fin element 214A, and a interfacial layer 1002 partially wraps around a channel layer 908B of the fin element 214B.

In some embodiments, the interfacial layer 1002 may include an oxide-containing material such as silicon oxide or silicon oxynitride, and may be formed by chemical oxidation using an oxidizing agent (e.g., hydrogen peroxide ($H_2O_2$), ozone ($O_3$)), plasma enhanced atomic layer deposition, thermal oxidation, ALD, CVD, and/or other suitable methods. In some embodiments, the interfacial layer 1002 of the fin element 214A and the interfacial layer 1002 of the fin element 214B include the same material. In some embodiments, interfacial layers 1002 of the fin elements 214A and 214B may be formed separately and include different materials. In some embodiments, a cleaning process, such as an HF-last pre-gate cleaning process (for example, using a hydrofluoric (HF) acid solution), may be performed before the interfacial layer 1002 is formed in the opening 804.

In some embodiments, the interposing feature 1024 includes at least one high-k dielectric layer 1004 of a high-k dielectric material disposed over and/or around the interfacial layer 1002 in the opening 804. In some embodiments, the high-k dielectric layer 1004 may have a thickness 1062 of about 0.5 nm to about 5 nm. In the example of FIG. 10A, a high-k dielectric layer 1004 completely wraps around a channel layer 908A of the fin element 214A, and a high-k dielectric layer 1004 partially wraps around a channel layer 908B. In some embodiments, the high-k dielectric layers 1004 of fin elements 214A and 214B include the same material. In some embodiments, the high-k dielectric layers 1004 of the fin elements 214A and 214B are formed separately and include different materials.

In some embodiments, the high-k dielectric material has a high dielectric constant, for example, greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide, strontium titanate, hafnium oxynitride ($HfO_xN_y$), other suitable metal-oxides, or combinations thereof. The high-k dielectric layer 1004 may be formed by ALD, chemical vapor deposition (CVD), physical vapor deposition (PVD), remote plasma CVD (RPCVD), plasma enhanced CVD (PECVD), metal organic CVD (MOCVD), sputtering, other suitable processes, or combinations thereof.

In some embodiments, the interposing feature 1024 includes at least one capping layer 1006 of a capping material disposed over and/or around the high-k dielectric layer 1004 in the opening 804. The capping layer 1006 may have a thickness 1064 of about 0.5 nm to about 5 nm. The capping material may include titanium nitride, tantalum nitride, tantalum carbide, other suitable materials, and/or a combination thereof. The capping material may be formed by ALD and/or other suitable methods. Alternatively, in some embodiments, the interposing feature 1024 does not include a capping layer.

In some embodiments, a sidewall of the interposing feature 1024 has a thickness 1028 of about 1 nm to about 6 nm, which may equal to a combined thickness of the thickness 1060 of the interfacial layer 1002, the thickness 1062 of high-k dielectric layer 1004, and the thickness 1064 of the capping layer 1006 if any.

In the example of FIG. 10A, the spacing distance 912 is equal to or less than twice of the combined thickness of the interfacial layer 1002 and the high-k dielectric layer 1004. As illustrated in FIG. 10A, for the fin element 214A, the spacing area 1012A is completely filled by portions of two interfacial layers 1002 and two high-k dielectric layers 1004, where the two high-k dielectric layers 1004 merge in the spacing area 1012A. For the fin element 214B, each of the two spacing areas 1012B along a supporting layer 910 is completely filled by portions of an interfacial layer 1002 and a high-k dielectric layer 1004.

Figure 10B:
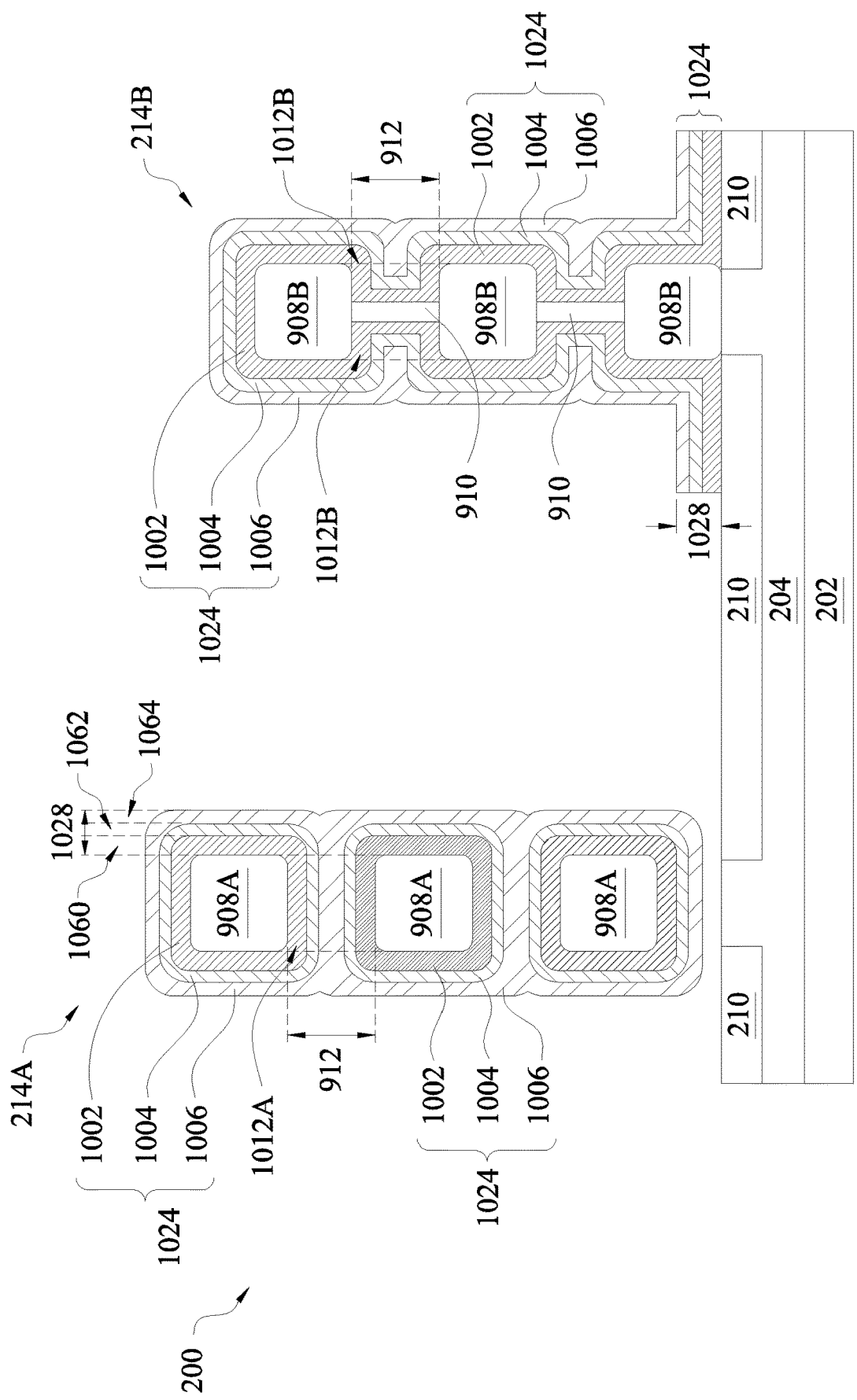

Referring now to the example of FIG. 10B, where the spacing distance 912 is greater than twice of the combined thickness of the interfacial layer 1002 and high-k dielectric layer 1004, but equal to or less than twice of the thickness 1028 of the interposing feature 1024. As illustrated in FIG. 10B, for the fin element 214A, the spacing area 1012A is completely filled by portions of two interfacial layers 1002, two high-k dielectric layers 1004, and two capping layers 1006, where the two capping layers 1006 merge in the spacing area 1012A. For the fin element 214B, each of the spacing areas 1012B along a supporting layer 910 is completely filled by portions of an interfacial layer 1002, a high-k dielectric layer 1004, and a capping layer 1006.

Figure 10C:
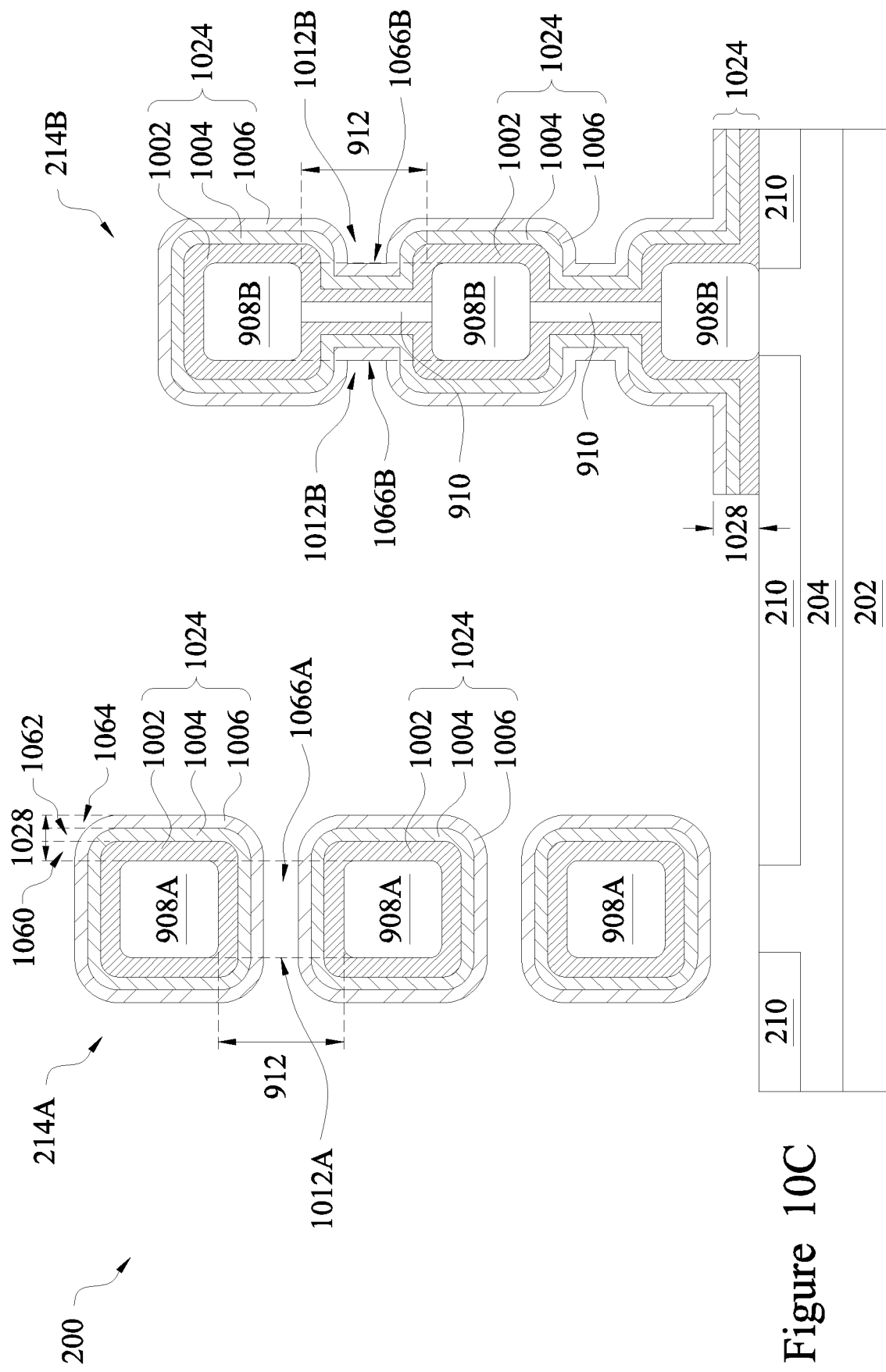

Referring now to the example of FIG. 10C, illustrated are fin elements 214A and 214B having a spacing distance 912 greater than twice of the thickness 1028 of the interposing feature 1024. As illustrated in FIG. 10C, the spacing area 1012A is partially filled by portions of two interfacial layers 1002, two high-k dielectric layers 1004, and two capping layers 1006. In the example of FIG. 10C, for the fin element 214A, the spacing area 1012A includes a gap 1066A disposed between the portions of the two capping layers 1006. For the fin element 214B, each of the two spacing areas 1012B along opposing sides of the supporting layer 910 is partially filled by portions of an interfacial layer 1002, a high-k dielectric layer 1004, and a capping layer 1006, and includes a gap 1066B disposed between portions of the capping layer 1006 in the spacing area 1012B.

Referring now to FIGS. 1B and 11A, 11B, and 11C, the method 150 proceeds to block 164, where a scavenging metal layer is deposited in the channel region of the fin elements. Referring to the examples of FIGS. 11A, 11B, and 11C, in various embodiments, spacing distances 912 between adjacent channel layers 908A, 908B may be different, which may affect the configurations of the scavenging layer 1102 (e.g., portions of the scavenging layer 1102 disposed in the gaps 902A and 902B). In some examples, the spacing areas 1012A and 1012B do not include any scavenging material. In some examples, the spacing areas 1012A and 1012B include portions of at least one scavenging layer 1102.

Figure 11A:
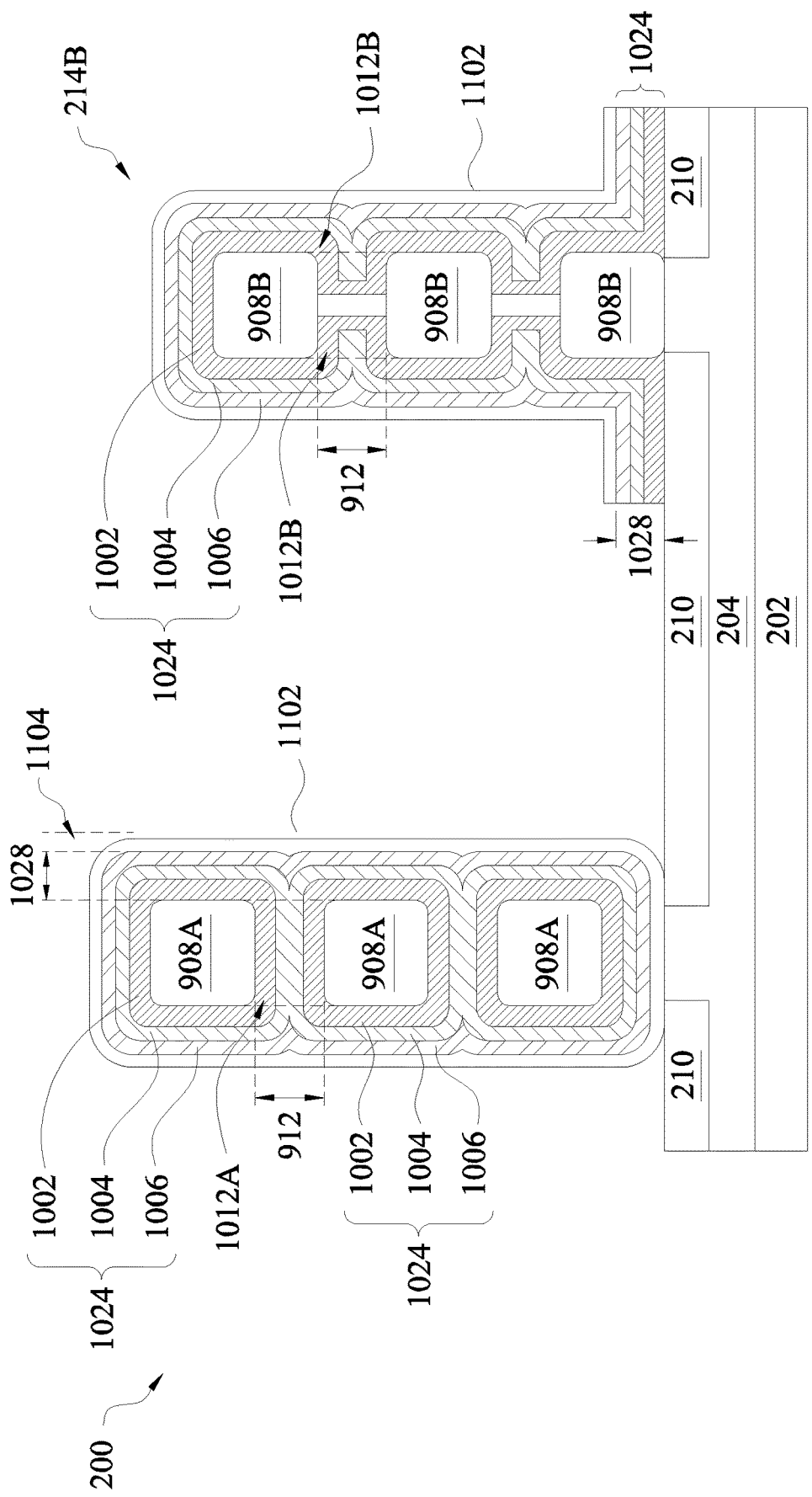
FIGS. 11A, 11B, and 11C are cross-sectional views of a portion of a semiconductor device according to various embodiments of the present disclosure.
Figure 11B:
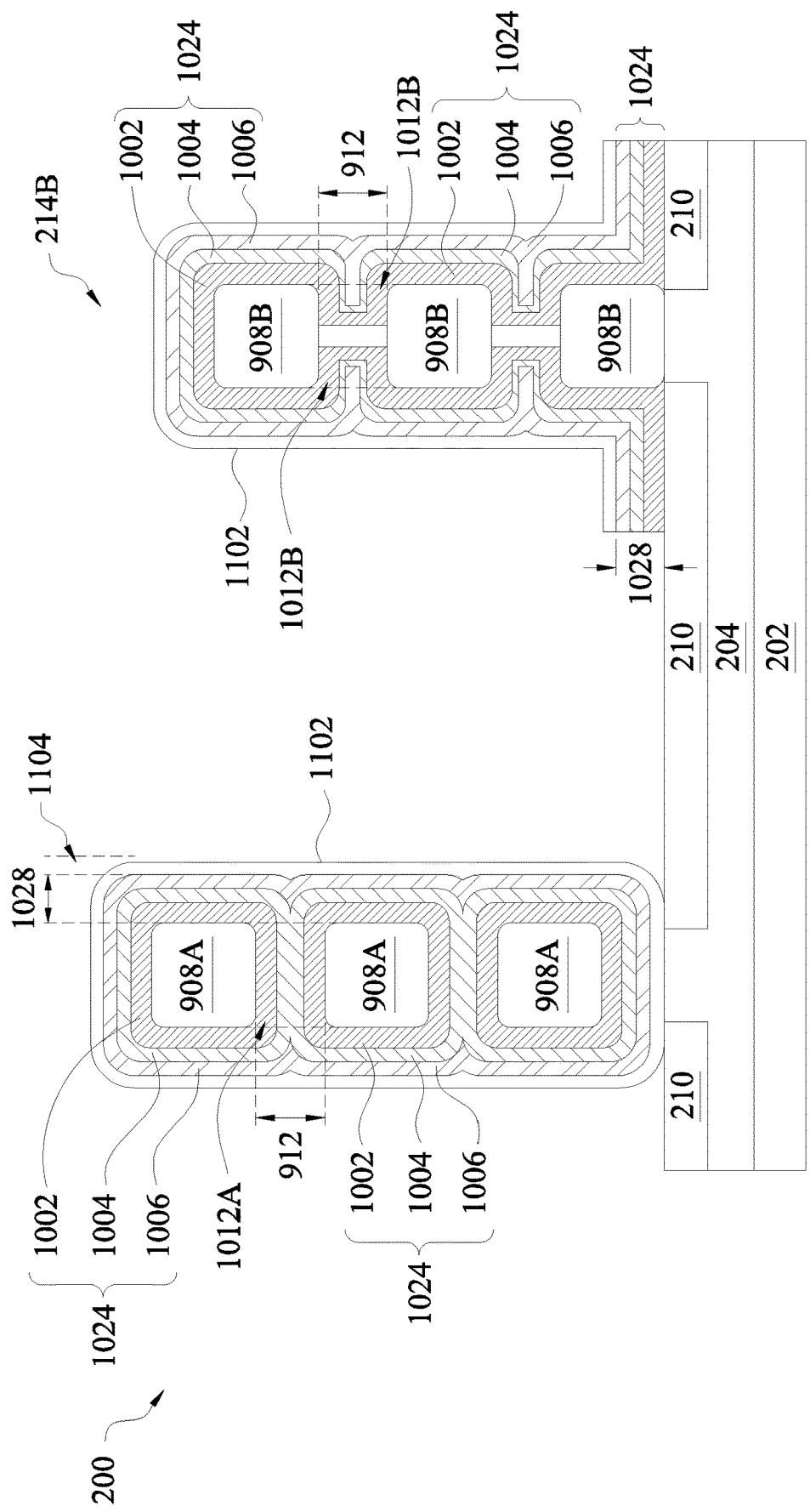

Referring to the examples of FIGS. 11A and 11B, illustrated are embodiments of a device 200 of FIGS. 10A and 10B respectively after a scavenging metal layer 1102 is disposed in the opening 804, where the spacing distances 912 are equal to or less than twice the thickness 1028 of the interposing feature 1024. In the examples of FIGS. 11A and 11B, a scavenging metal layer 1102 at least partially wraps around the interposing feature 1024 of the fin elements 214A, 214B. In some embodiments, the scavenging metal layer 1102 may have a thickness 1104 of about 0.5 nm to about 6 nm. The scavenging metal layer 1102 may include a scavenging material, such as titanium, hafnium, zirconium, tantalum, titanium nitride, tantalum nitride, tantalum silicon nitride, titanium silicon nitride, other suitable material, or combinations thereof. The scavenging material may be configured to facilitate a scavenging process on the interfacial layer 1002. In the examples of FIGS. 11A and 11B, the spacing areas 1012A and 1012B are free of the scavenging material.

Figure 11C:
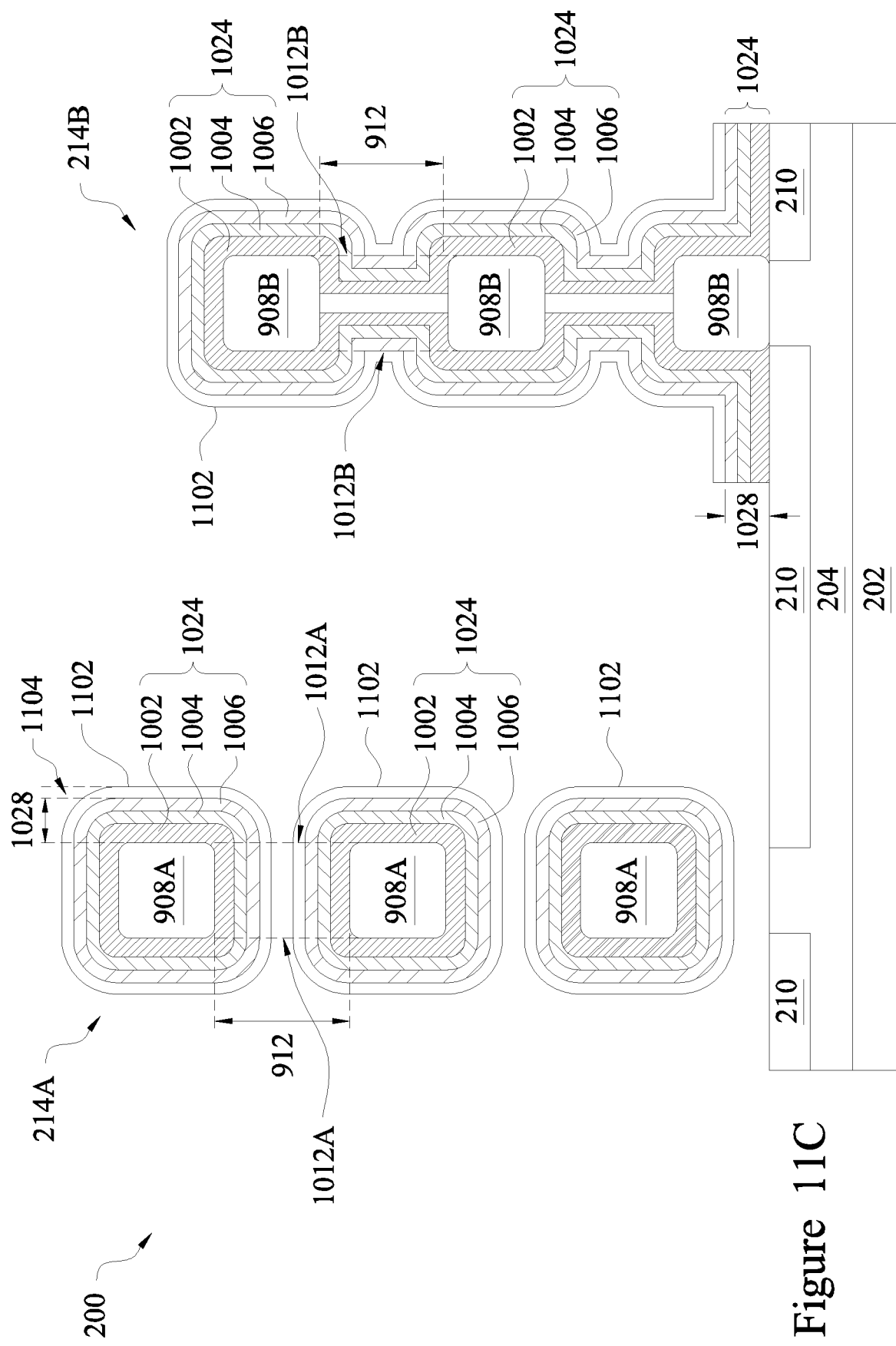

Referring to the example of FIG. 11C, illustrated is embodiments of a device 200 of FIG. 10C after a scavenging metal layer 1102 is disposed in the opening 804, where the spacing distances 912 are greater than twice of the thickness 1028 of the interposing feature 1024. As illustrated in the example of FIG. 11C, the spacing area 1012A includes the portions of the two scavenging metal layers 1102, which at least partially fill the gap 1006A of the fin element 214A. In the examples of FIG. 11C, the spacing areas 1012B include portions of the scavenging metal layer 1102, which at least partially fill the gaps 1006B in the spacing areas 1012B.

In some embodiments, the scavenging metal layer 1102 may be formed by ALD, chemical vapor deposition (CVD), physical vapor deposition (PVD), remote plasma CVD (RPCVD), plasma enhanced CVD (PECVD), metal organic CVD (MOCVD), sputtering, other suitable processes, or combinations thereof.

Referring to FIGS. 1B, 12A, 12B, 12C, 12D, 13A, 13B, and 13C, the method 150 proceeds to block 166, where a scavenging process is performed on the interfacial layer 1002 to form a treated interfacial layer 1202. Referring to the examples of FIGS. 12A and 12C, one or more annealing processes may be performed to cause a scavenging process to the interfacial layer 1002.

In various embodiments, the annealing processes may comprise rapid thermal annealing (RTA), laser annealing processes, or other suitable annealing processes. As an example, the annealing processes may include a high temperature thermal annealing step that may apply temperatures in the range of about 600° C. and 1000° C., though other embodiments may use temperatures within a different range.

In various embodiments, a scavenging process may be used to improve device performance. For example, the scavenging process may be used to reduce the EOT of the gate structure. For further example, the scavenging process may be used to reduce interface dipole between the interfacial layer 1002 and high-k dielectric layer 1004, so that the flat band voltage $V_{fb}$ and/or threshold voltage $V_t$ of the device 200 may be tuned. For further example, the scavenging process may help increase the threshold voltage $V_t$ by a voltage in the range of about 50 millivolt to about 200 millivolt.

To achieve the desired device performance improvements, in some embodiments, all areas of the interfacial layer 1002 are scavenged during the scavenging process to form a treated interfacial layer 1202 that is uniform. Un-scavenged areas may cause non-uniformity of the treated interfacial layer 1202, which may create issues associated with non-uniform device turn on or effective area reduction in the gate structure. In some examples, a particular area of the interfacial layer 1002 is not scavenged during the scavenging process because the particular area has a distance to the scavenging layer 1202 (also referred to as a scavenging distance) greater than a predetermined scavenging threshold T (e.g., 6 nm).

In various embodiments, uniformity of the treated interfacial layer 1202 may be affected by the greatest scavenging distance of all areas of the interfacial layer 1002, which is also referred to as a maximum scavenging distance of the interfacial layer 1002. To ensure that all areas of the interfacial layer 1002 are scavenged for form a treated interfacial layer 1202 that is uniform, it may be designed that a maximum scavenging distance 1258 of the interfacial layer 1002 is equal to or less than the predetermined scavenging threshold T.

Referring to the examples of FIGS. 12A and 12B, in some embodiments, all areas of an interfacial layer 1002 are scavenged to form a uniform treated interfacial layer 1202. As illustrated in FIG. 12A, a scavenging layer 1102 completely wraps around the interfacial layer 1002, and the maximum scavenging distance 1258 (e.g., equal to a thickness 1028 of the interposing feature 1024) is less than a predetermined scavenging threshold T. As illustrated in FIG. 12B, all areas of the interfacial layer 1002 are scavenged to form a uniform treated interfacial layer 1202. The treated interfacial layer 1202 may include a first layer 1204. In some examples, the first layer 1204 is an epitaxially grown silicon layer, and may become a part of the channel layer 908.

In some embodiments, the interfacial layer 1002 may be fully converted to the first layer 1204 (e.g., by adjusting the scavenging metal layer 1102's oxygen affinity and/or annealing parameters). In one example, the first layer 1024 has a thickness 1250 that is about the same as the thickness 1060 of the interfacial layer 1002. The final EOT of the dielectric stack may be defined solely by the EOT of the high-k dielectric layer 1004.

Alternatively, as illustrated in the example of FIG. 12B, in some embodiments, the treated interfacial layer 1202 may include a second layer 1206 with a thickness 1252 less than the thickness 1060 of the interfacial layer 1002 (e.g., by adjusting the scavenging metal layer 1102's oxygen affinity and/or annealing parameters). In some examples, the second layer 1206 includes the same material as the material of the interfacial layer 1002. The final EOT of the dielectric stack may be defined by the EOT of the second layer 1206 and the EOT of the high-k dielectric layer 1004.

Figure 12D:
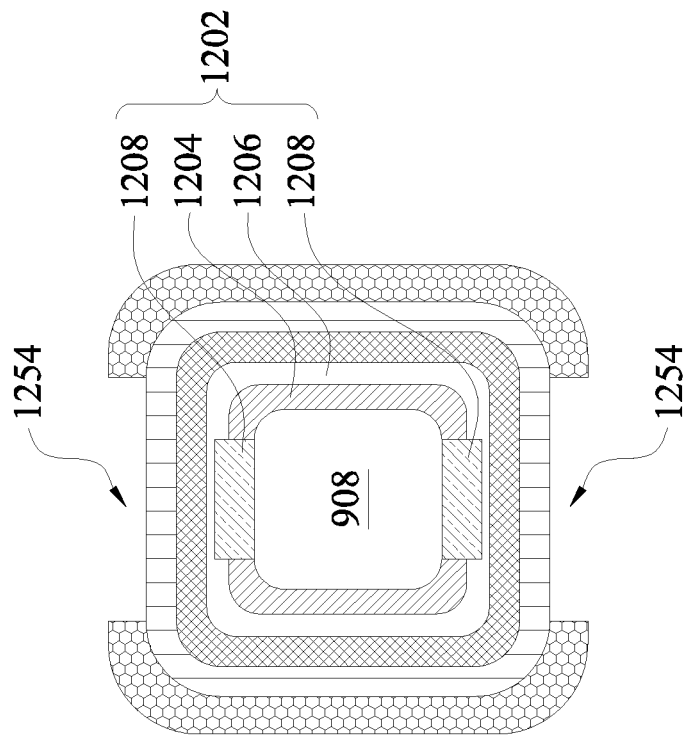
Figure 12C:
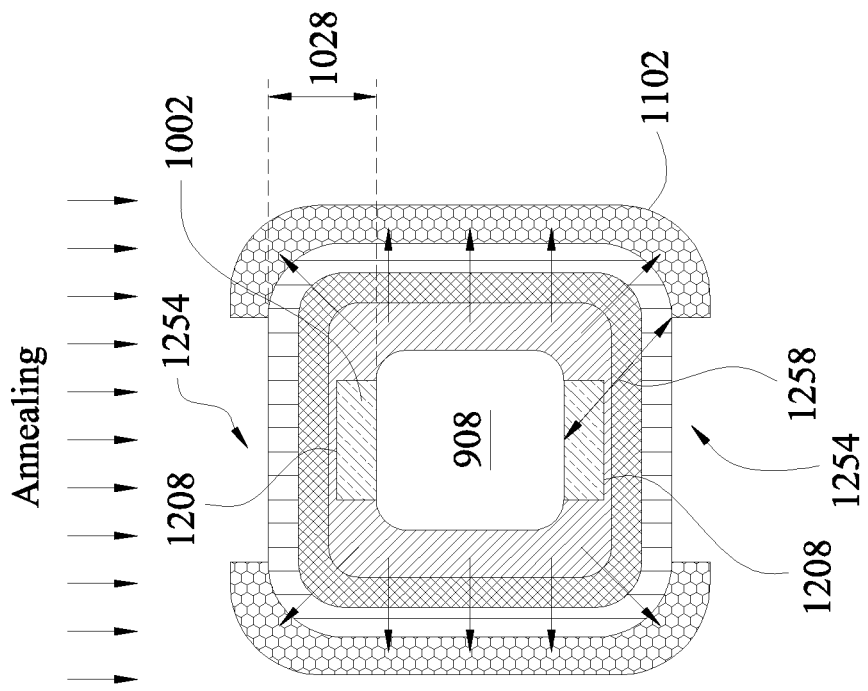

Referring to the examples of FIGS. 12C and 12D, in some embodiments, some areas of an interfacial layer 1002 are not scavenged during the scavenging process. As illustrated in FIG. 12C, the scavenging metal layer 1102 includes gaps 1254, and does not uniformly wrap around the interfacial layer 1002. The maximum scavenging distance 1258 equals to a scavenging distance of areas 1208, and is greater than a predetermined scavenging threshold T. As such, areas 1208 are not scavenged during the scavenging process. Referring now to the example of FIG. 12D, the treated interfacial layer 1202 includes un-scavenged areas 1208, which affects the uniformity of the treated interfacial layer 1202. In some embodiments, the un-scavenged areas 1208 extend between the first layer 1204 and second layer 1206. In the example of FIG. 12D, the final EOT of the dielectric stack may be affected by the second layer 1206, the un-scavenged areas 1208, and the EOT of the high-k dielectric layer 1004.

Figure 13A:
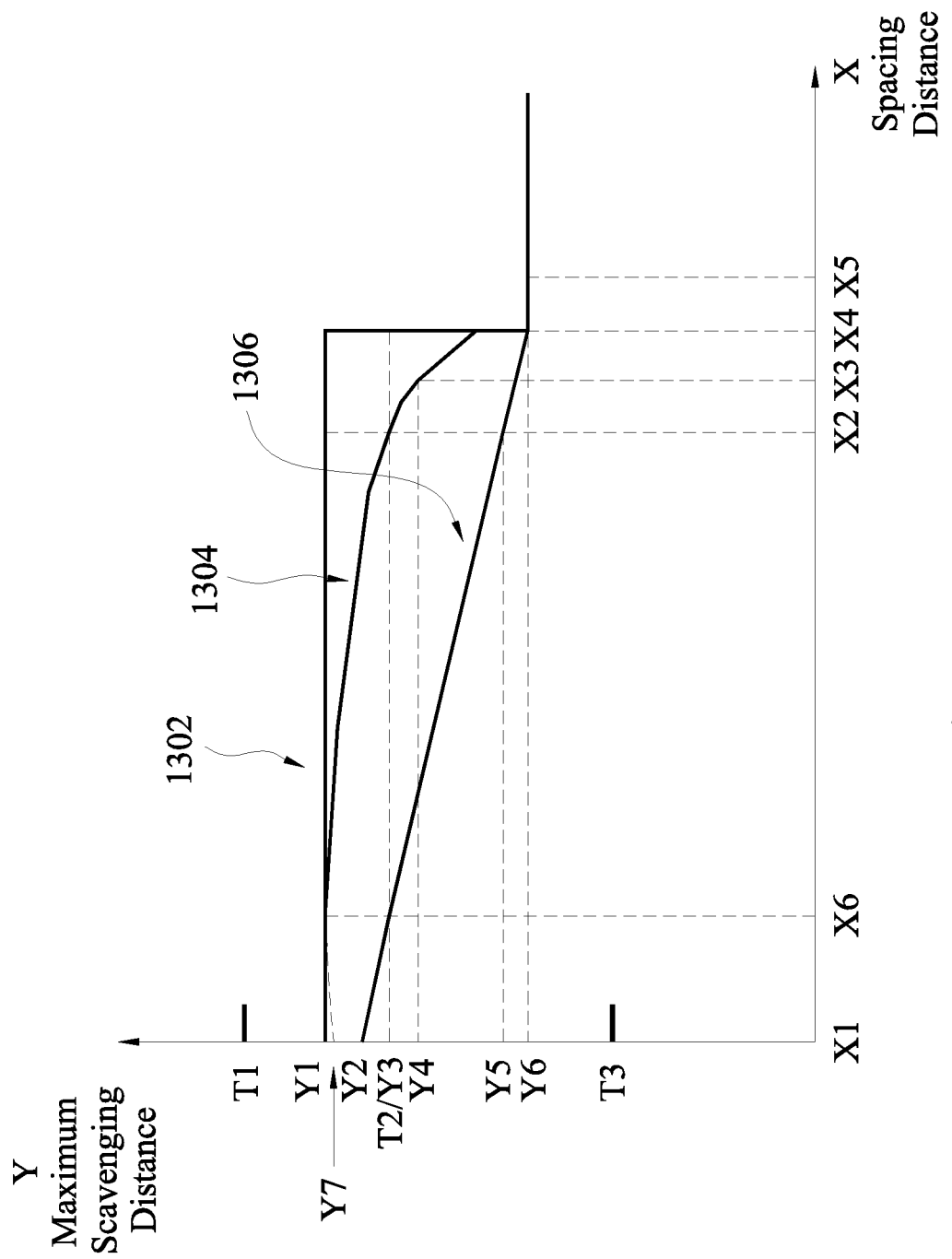
FIGS. 13A, 13B, and 13C are graphs illustrating maximum scavenging distances of interfacial layers as a function of spacing distance between adjacent channel semiconductor layers and channel cross-sectional profiles according to various embodiments.
Figure 13B:
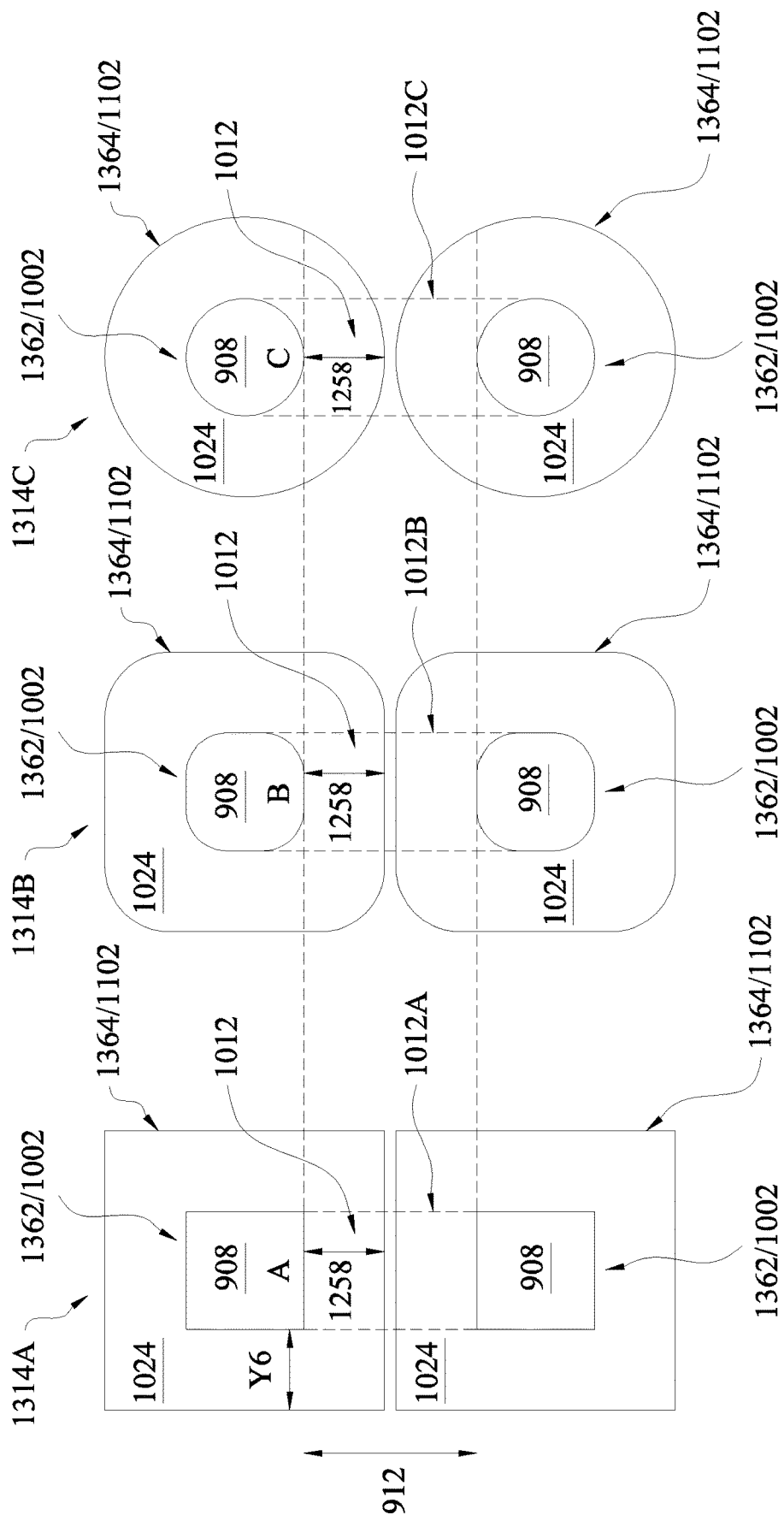
Figure 13C:
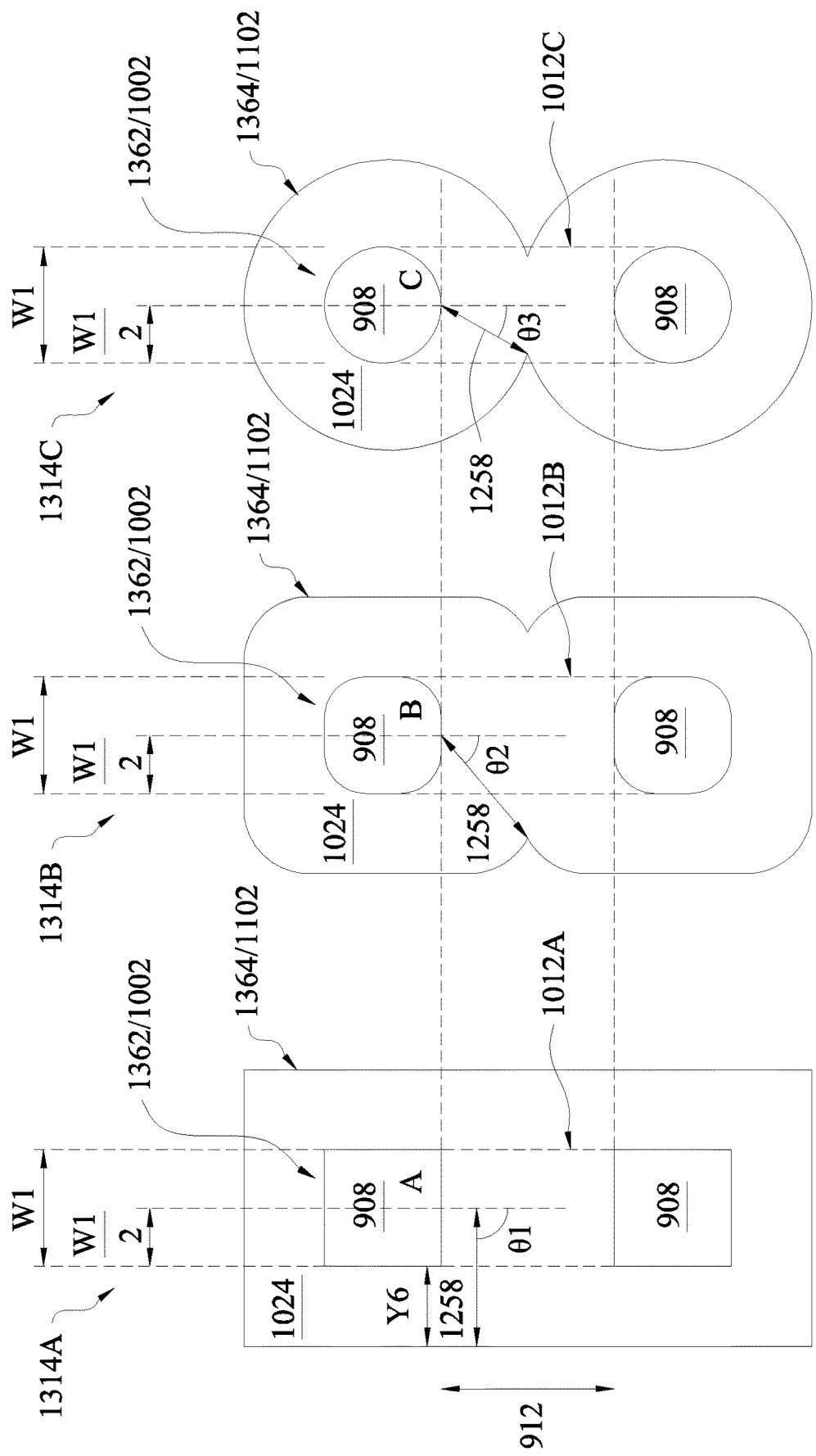

Referring now to FIGS. 13A, 13B, and 13C, in some embodiments, the maximum scavenging distance 1258 of an interfacial layer 1002 of a fin element may be affected by the spacing distance 912 between adjacent channel layers and/or channel cross-sectional profiles 904 of the channel layers. It is noted that to simplify discussion, in the example of FIGS. 13A, 13B, and 13C, the interposing features 1024 of the fin elements 1314A, 1314B, 1314C have the same thickness 1028 (e.g., Y6), and the channel layers 908 of the fin elements 1314A, 1314B, 1314C have the same channel layer widths 914 (e.g., W1) and channel layer heights 918 (e.g., W1). While the channel cross-sectional profiles discussed here are of shapes including a square, a rounded square, and a circle, it will be understood that channel cross-sectional profiles of other shapes (e.g., a diamond, an oval, a rectangle) are possible, and are intended to fall within the scope of the present disclosure.

Referring to FIG. 13A, exemplary curves 1302, 1304, and 1306 illustrate maximum scavenging distances 1258 as a function of spacing distances 912 and channel cross-sectional profiles 904. Particularly, curves 1302, 1304, and 1306 correspond to fin elements 1314A, 1314B, 1314C having channel cross-sectional profiles 904 of a square, a rounded square, and a circle respectively. In FIG. 13A, the horizontal axis "X" represents the spacing distance 912, and the vertical axis "Y" represents the maximum scavenging distance 1258 of the interfacial layer 1002. As illustrated in FIG. 13A, the fin elements 1314A, 1314B, 1314C with various channel cross-sectional profiles may have different maximum scavenging distances 1258 at a particular spacing distance between X1 and X4. In some embodiments, X4 is equal to twice the thickness 1028 (e.g., Y6) of the interposing feature 1024.

Referring now to the examples of FIGS. 13B and 13C, simplified fin elements 1314A, 1314B, and 1314C further illustrate that maximum scavenging distances 1258 may be affected by the channel cross-sectional profiles 904 of channel layers 908.

As shown in the examples of FIGS. 13B and 13C, the maximum scavenging distance 1258 may increase when the spacing distance 912 decreases. In the example of FIG. 13B, the fin element 1314A has a spacing distance 912 (e.g., greater than twice of Y6) so that its spacing area 1012A includes a portion of the scavenging metal layer 1102 disposed directly under the area A of the interfacial layer 1002. Thus, the fin element 1314A has a maximum scavenging distance 1258 (e.g., Y6) extending vertically from the area A to the inner surfaces 1364 of the scavenging metal layer 1102. Referring now to the example of FIG. 13C, as the spacing distance 912 of the fin elements 1314A decreases (e.g., to less than twice of Y6), the spacing area 1012A becomes smaller, and there is no scavenging layer 1102 disposed directly under the area A. Thus, the maximum scavenging distance 1258 of the fin element 1314A increases, and extends from the area A to the scavenging metal layers 1102 in a direction at an angle $\theta_1$ (e.g., 90 degrees) with the vertical line.

Similarly, as shown in the example of FIG. 13C, the maximum scavenging distances 1258 of fin elements 1314B and 1314C may also increase as the spacing distance 912 decreases. However, because of the different channel cross-sectional profiles, the respective maximum scavenging distances 1258 may extend from areas B, and C to the scavenging metal layers 1102 in different directions (e.g., at angles $\theta_2$, and $\theta_3$ with the vertical line respectively, where $\theta_2$ may be less than $\theta_1$, and/or $\theta_3$ may be less than $\theta_2$), and have different values. For example, the maximum scavenging distance 1258 of the fin element 1314C having a circle shaped cross-sectional profile may be less than the maximum scavenging distances 1258 of both the fin elements 1314A and 1314B.

In some embodiments, the spacing distances 912 and/or channel cross-sectional profiles 904 may be chosen based a predetermined scavenging threshold T used in the scavenging process based on device performance considerations (e.g., channel semiconductor layers density, scavenging uniformity, EOT thickness, and/or $V_{fb}$ and/or $V_t$ tuning).

Referring back to FIG. 13A, three scavenging thresholds T1, T2, and T3 are illustrated. The scavenging threshold T1 is greater than Y1, the scavenging threshold T2 (the same as Y3) is between Y1 and Y6, and the scavenging threshold T3 is less than Y6.

In some embodiments where the scavenging process uses the scavenging threshold T1, all areas of the interfacial layers 1002 of all fin elements 1314A, 1314B, and 1314C may be scavenged regardless of the spacing distance and channel cross-sectional profile to form treated interfacial layers 1202 that do not include any un-scavenged areas 1208.

Alternatively, in some embodiments where the scavenging process uses the scavenging threshold T3, for each of the fin elements 1314A, 1314B, and 1314C, at least an area 1208 of an interfacial layer 1002 is not scavenged regardless of the spacing distance and channel cross-sectional profile, and the treated interfacial layer 1202 includes the un-scavenged area 1208, which affects the uniformity of the treated interfacial layer 1202.

Alternatively, in some embodiments where the scavenging process uses the scavenging threshold T2 that is greater than Y6 but less than Y1, spacing distances 912 and/or channel cross-sectional profiles 904 may be chosen to form a treated interfacial layer 1202 that is uniform (e.g., not including any un-scavenged areas 1208) based on the scavenging threshold T2 and/or desired channel layer density. As shown in FIG. 13A, the minimum spacing distance to ensure that all areas of the interfacial layer 1002 are scavenged is X4, X2, and X6 for fin elements 1314A, 1314B, and 1314C respectively. Because X6 is less than X2, which is less than X4, the fin element 1314C may have a greater channel layer density than the fin element 1314B, which may have a greater channel layer density than the fin element 1314A.

In some embodiments, the maximum scavenging distance 1258 of the interfacial layer 1002 may be affected by other parameters (e.g., width of supporting layers 910).

Figure 14A:
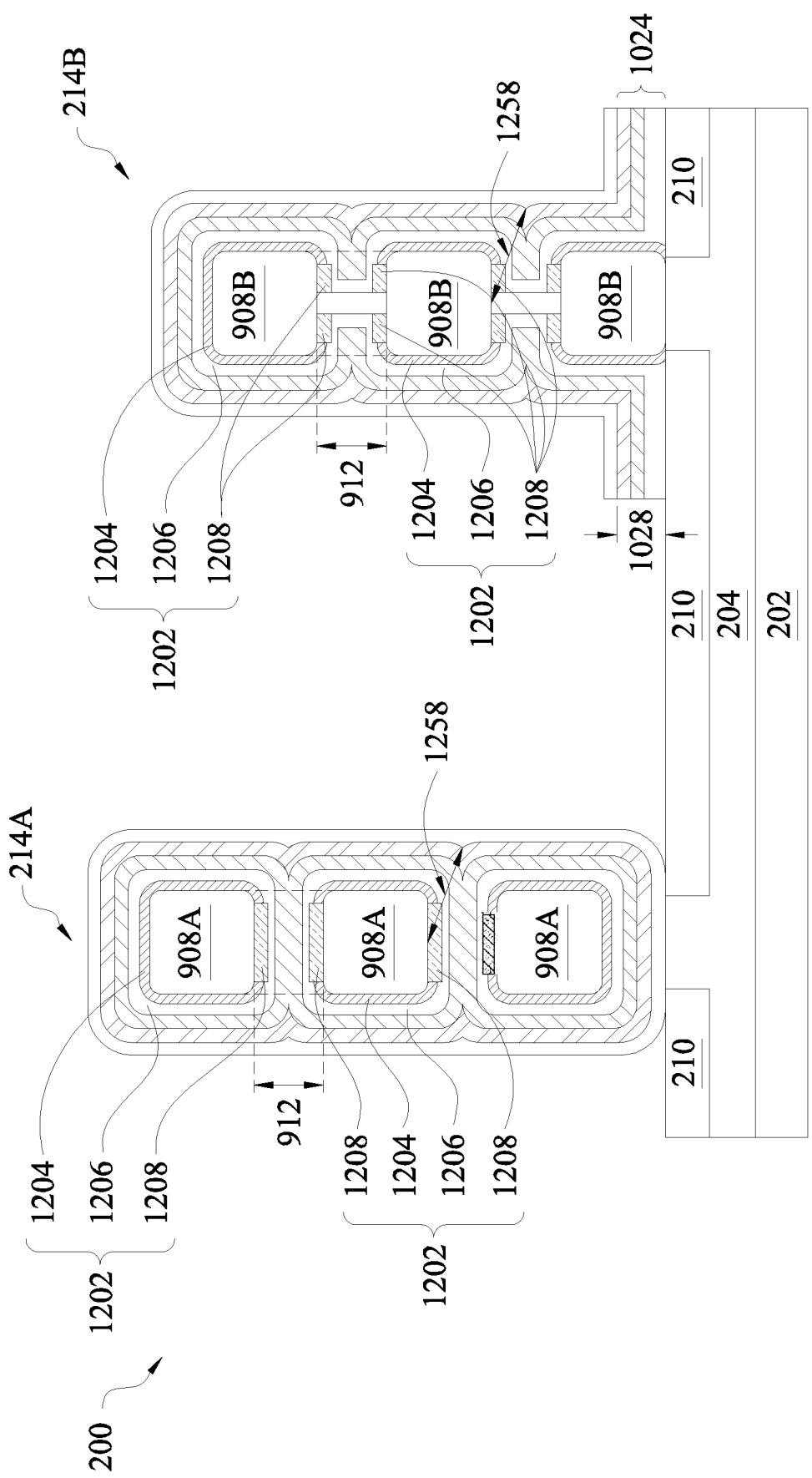
FIGS. 14A, 14B, and 14C are cross-sectional views of a portion of a semiconductor device according to some embodiments.
Figure 14B:
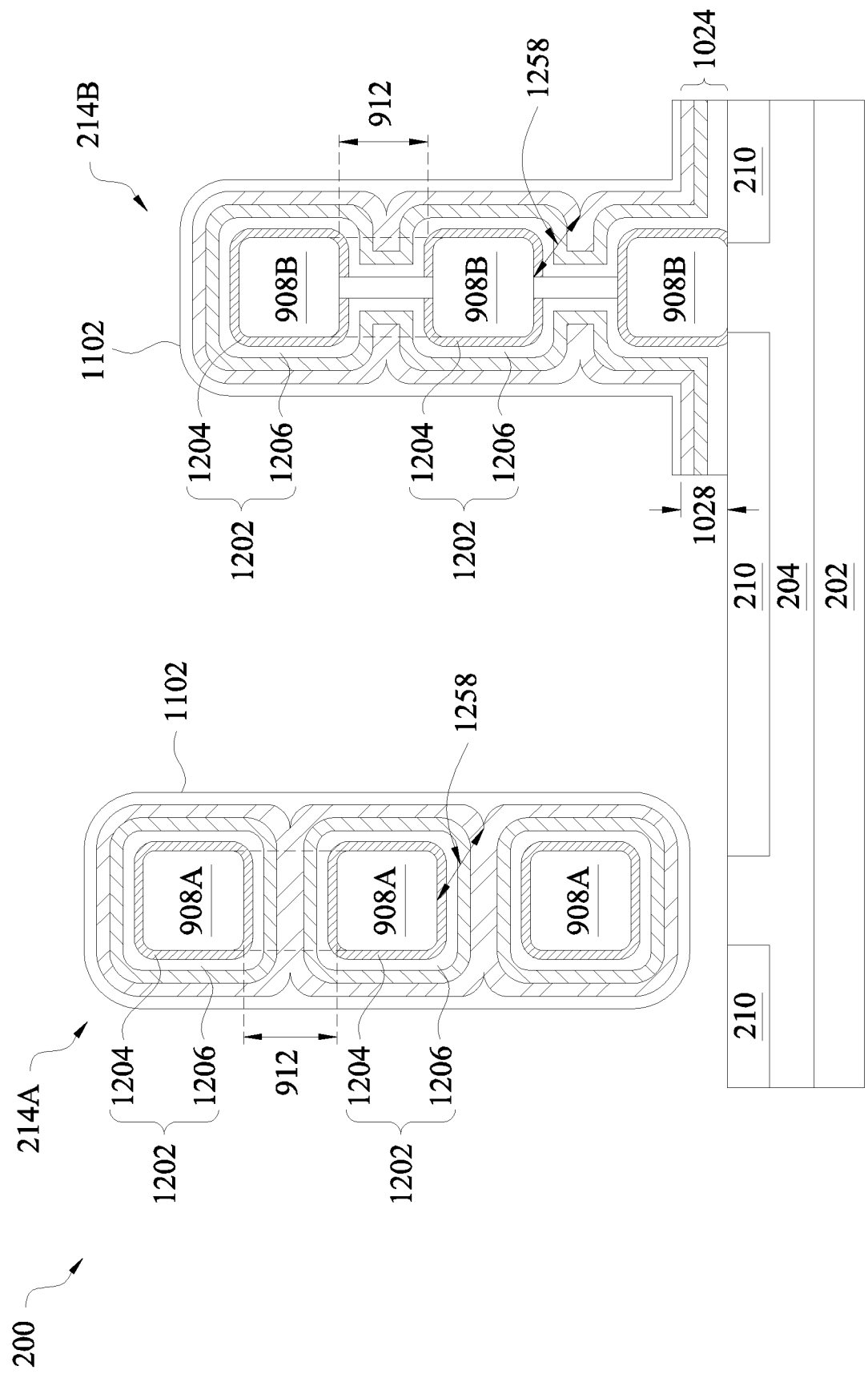
Figure 14C:
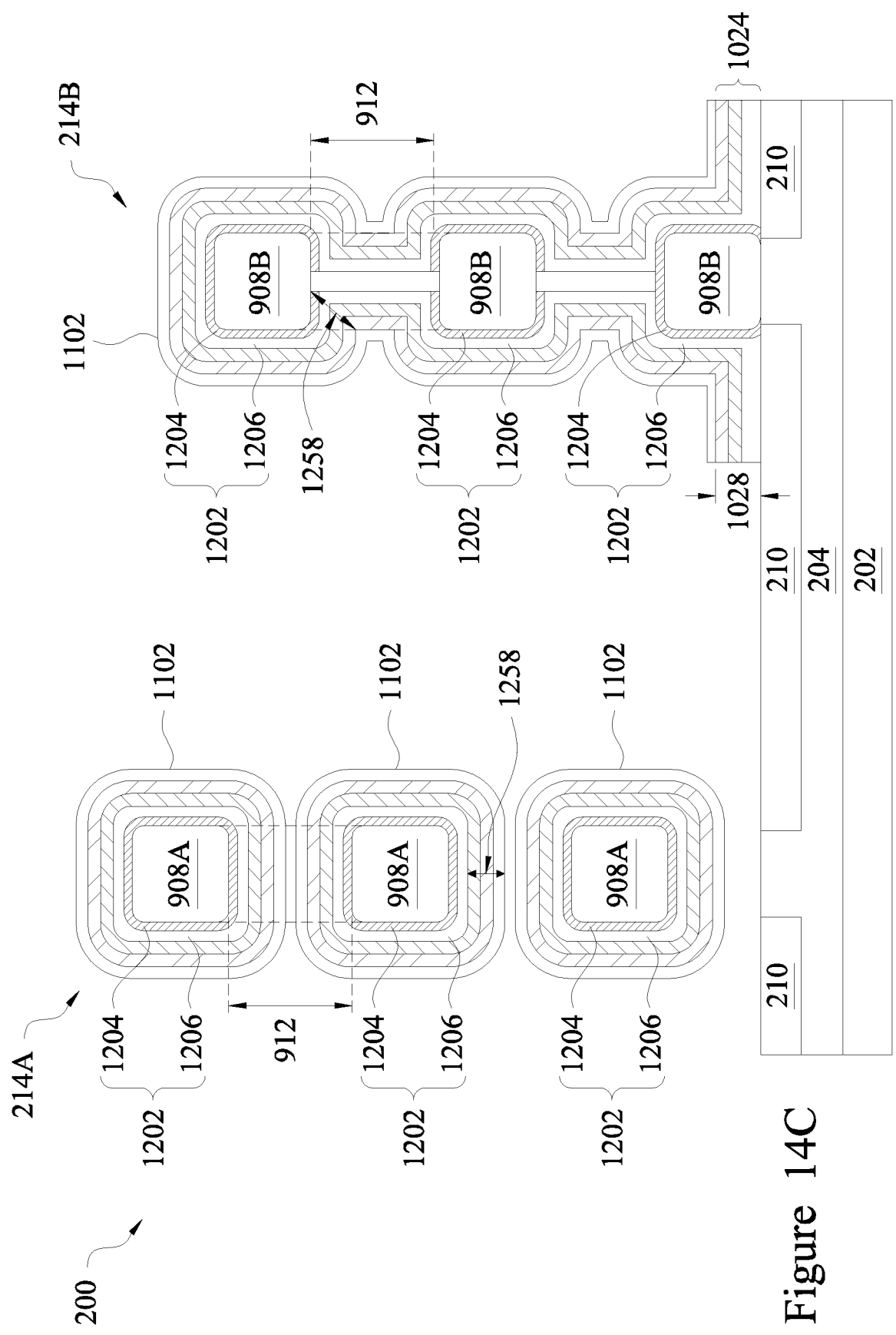

Referring now to the examples of FIGS. 14A, 14B, and 14C, illustrated is a device 200 with fin elements 214A and 214B of various spacing distances with rounded square channel cross-sectional profiles after a scavenging process is performed. In some examples, one or both of the fin elements 214A and 214B correspond to the curve 1304 of FIG. 13A.

Referring now to the examples of FIG. 14A, the fin elements 214A and 214B have a spacing distance 912 of X6 and a maximum scavenging distance 1258 of Y7. As illustrated in FIGS. 13A and 14A, because the maximum scavenging distance Y7 of the interfacial layer 1002 is greater than the scavenging threshold T2, in some embodiments, areas 1208 of the interfacial layer 1002 are not scavenged during the scavenging process, and the treated interfacial layer 1202 includes un-scavenged areas 1208.

In the examples of FIG. 14B, the fin elements 214A and 214B have a spacing distance 912 of X3 less than X4 and a maximum scavenging distance 1258 of Y4. As illustrated in FIGS. 13A and 14B, because the maximum scavenging distance Y4 of the interfacial layer 1002 is less than the scavenging threshold T2, all areas of the interfacial layer 1002 are scavenged during the scavenging process, and the treated interfacial layer 1202 does not include any un-scavenged areas 1208.

In the examples of FIG. 14C, the fin elements 214A and 214B have a spacing distance 912 of X5 greater than X4 and a maximum scavenging distance 1258 of Y6. As illustrated in FIGS. 13A and 14C, because the maximum scavenging distance Y6 of the interfacial layer 1002 is less than the scavenging threshold T2, all areas of the interfacial layer 1002 are scavenged during the scavenging process, and the treated interfacial layer 1202 does not include any unscavenged areas 1208.

In some embodiments, after the scavenging process is performed, the scavenging metal layer 1102 may be removed by using a suitable etching process (e.g., dry or wet etching).

Figure 15:
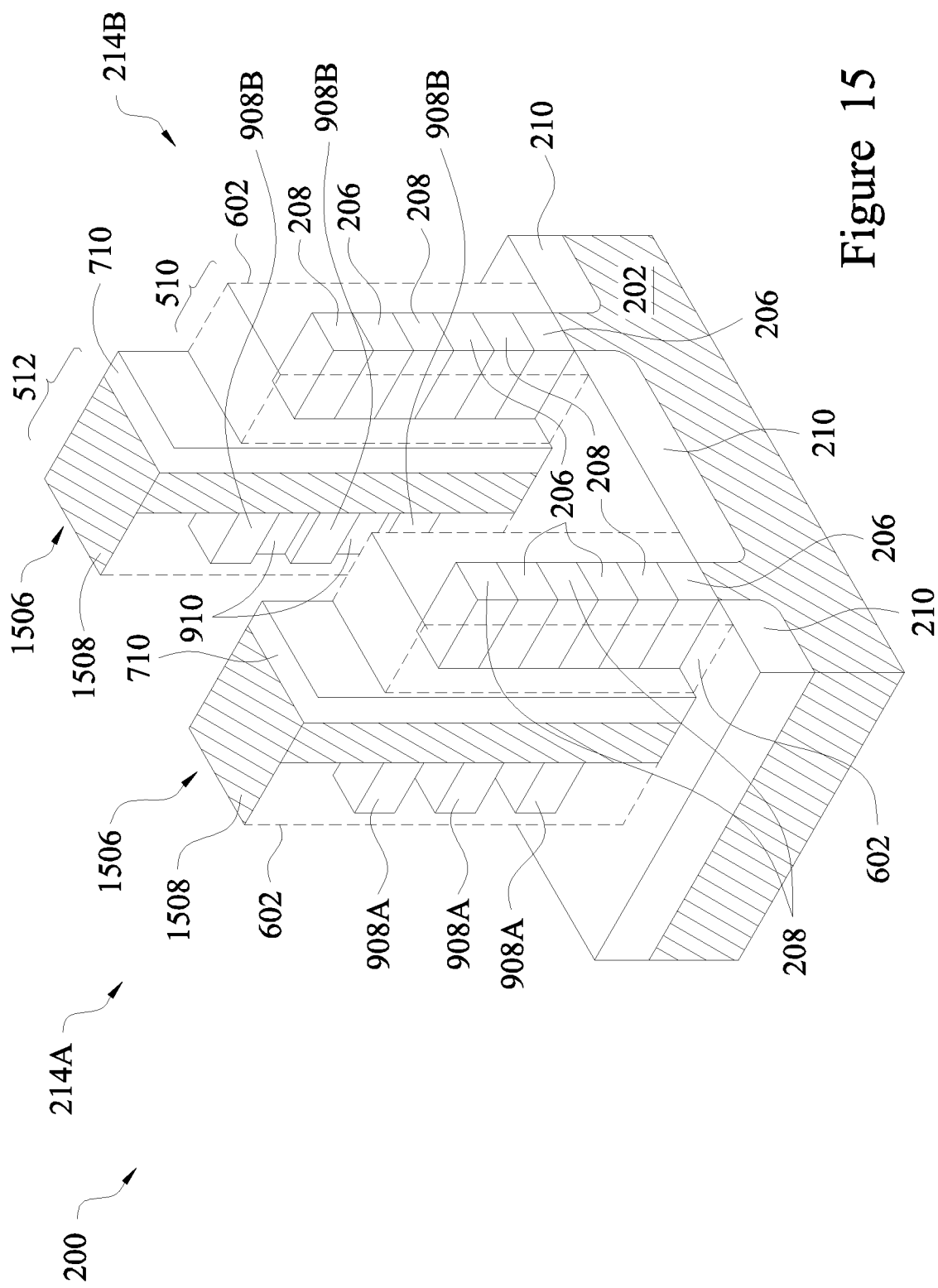
FIG. 15 is a perspective view of a portion of a semiconductor device according to some embodiments.

Referring now to FIGS. 1 and 15, the method 150 proceeds to block 168, where a metal layer is formed over the substrate 202. For ease of reference, the interposing feature 1024 and scavenging metal layer 1102 are omitted in the gate stack 1506 in FIG. 15, and the ILD layer 702, CESL 704, and the dielectric layer 708 are also omitted in FIG. 15.

Referring to the example of FIG. 15, gate stacks 1506 may be formed in the channel regions of the fin elements 214A and 214B may be a portion of a first device 1502A and a second device 1502B respectively. The gate stack 1506 may include a gate metal layer 1508 disposed in the channel regions 512. The gate metal layer 1508 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate metal layer 1508 of the gate stack 1506 may include Ti, Ag, Al, TiAlN, TaC, TaCN, TaSiN, Mn, Zr, TiN, TaN, Ru, Mo, Al, WN, Cu, W, Re, Jr, Co, Ni, other suitable metal materials or a combination thereof. In various embodiments, the gate metal layer 1508 of the gate stack 1506 may be formed by ALD, PVD, CVD, e-beam evaporation, or other suitable process. Further, the gate metal layer 1508 may be formed separately for N-FET (e.g., fin element 214A) and P-FET transistors (e.g., fin element 214B) which may use different metal layers. In various embodiments, a CMP process may be performed to remove excessive metal from the gate metal layer 1508 of the gate stack 1506, and thereby provide a substantially planar top surface of the gate metal layer 1508 of the gate stack 1506. In addition, the gate metal layer 1508 may provide an N-type or P-type work function, may serve as a transistor (e.g., FINFET) gate electrode, and in at least some embodiments, the gate metal layer 1508 may include a polysilicon layer.

The semiconductor device 200 may undergo further processing to form various features and regions known in the art. For example, subsequent processing form contact openings, contact metal, as well as various contacts, vias, wires, and multilayer interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias and contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 150, and some process steps described above may be replaced or eliminated in accordance with various embodiments of the method 150.

The embodiments of the present disclosure offer advantages over existing art, although it is understood that different embodiments may offer different advantages, not all advantages are necessarily discussed herein, and that no particular advantage is required for all embodiments. By utilizing the disclosed method and structure, interfacial layers on/around vertically stacked nanowires may be scavenged uniformly without requiring scavenging metal layers disposed between the vertically adjacent nanowires, which may reduce nanowire spacing requirement and increase nanowire density. In one example, the nanowires may be shaped to have a cross-sectional profile of a predetermined shape based on a scavenging threshold and/or desired nanowire density, such that all areas of the interfacial layers may be scavenged during the scavenging process to form a uniformly treated interfacial layer. By uniformly scaling down the interfacial layer, the EOT of the dielectric stack can be improved, and the flat band voltage $V_{fb}$ and/or threshold voltage $V_t$ may be uniformly tuned, which in turn can improve overall device performance.

Thus, one aspect of the present disclosure involves a method of forming a semiconductor device. A fin extending from a substrate is provided. The fin has a source/drain region and a channel region, and includes a first layer disposed over the substrate, a second layer disposed over the first layer, and a third layer disposed over the second layer. At least a portion of the second layer is removed from the channel region to form a gap between the first and third layers. A first material is formed in the channel region to form a first interfacial layer portion at least partially wrapping around the first layer and a second interfacial layer portion at least partially wrapping around the third layer. A second material is deposited in the channel region to form a first high-k dielectric layer portion at least partially wrapping around the first interfacial layer portion and a second high-k dielectric layer portion at least partially wrapping around the second interfacial layer portion. A metal layer including scavenging material is formed along opposing sidewalls of the first and second high-k dielectric layer portions in the channel region.

Another aspect of the present disclosure involves a method including forming a fin element including first, second, and third semiconductor layers. At least a portion of the second semiconductor layer is removed from a channel region of the fin element to form a gap between the first and third layers. An interposing feature is formed in the channel region. The interposing feature includes a first interfacial layer portion at least partially wrapping around the first semiconductor layer, a first high-k dielectric layer portion at least partially wrapping around the first interfacial layer portion, a second interfacial layer portion at least partially wrapping around the second semiconductor layer, and a second high-k dielectric layer portion at least partially wrapping around the second interfacial layer portion. A metal layer at least partially wrapping around the interposing feature is deposited. The metal layer includes a scavenging material.

Yet another aspect of the present disclosure involves a semiconductor device. The semiconductor device includes a fin element extending from a substrate. A channel region of the fin element includes a first semiconductor layer, a second semiconductor layer disposed over the first semiconductor layer and vertically separated from the first semiconductor layer by a spacing area, a first high-k dielectric layer portion at least partially wrapping around the first semiconductor layer, a second high-k dielectric layer portion at least partially wrapping around the second semiconductor layer, and a metal layer formed along opposing sidewalls of the first and second high-k dielectric layer portions. The metal layer includes a scavenging material, and the spacing area is free of the scavenging material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   providing a fin having a channel region, wherein the fin includes first, second, and third layers;
   removing at least a portion of the second layer from the channel region to form a gap between the first and third layers;
   forming an interposing feature in the channel region at least partially wrapping around the first layer and the third layer, wherein the interposing feature includes more than one layer at least partially wrapping around the first layer and the third layer; and
   forming a metal layer along opposing sidewalls of the interposing feature for performing a scavenging process to the interposing feature,
   wherein a distance between the first layer and third layer is determined based on a predetermined scavenging threshold of the scavenging process.

2. The method of claim 1, wherein the forming the interposing feature includes:
   forming a first material in the channel region to form a first interfacial layer portion at least partially wrapping around the first layer and a second interfacial layer portion at least partially wrapping around the third layer.

3. The method of claim 2, wherein the first material includes an oxide-containing material.

4. The method of claim 1, wherein at least one of the first layer and the third layer has a profile determined based on the predetermined scavenging threshold.

5. The method of claim 1, wherein each of the first and third layers has a rounded profile.

6. The method of claim 1, wherein the scavenging process is performed to tune at least one of a flat band voltage and a threshold voltage of the semiconductor device.

7. The method of claim 1, wherein the scavenging process is performed to reduce the equivalent oxide thickness (EOT) of the semiconductor device.

8. A method, comprising:
   forming a fin element including first, second, and third semiconductor layers;
   removing at least a portion of the second semiconductor layer from a channel region of the fin element to form a gap between the first and third semiconductor layers;
   forming an interposing feature in the channel region, wherein the interposing feature includes:
      more than one dielectric layer at least partially wrapping around the first semiconductor layer and the third semiconductor layer; and
   depositing a metal layer at least partially wrapping around the interposing feature for performing a scavenging process to the interposing feature.

9. The method of claim 8, wherein the metal layer includes a first material, and wherein the gap is free of the first material.

10. The method of claim 8, wherein the more than one dielectric layer includes:
    a first interfacial layer portion at least partially wrapping around the first semiconductor layer;
    a second interfacial layer portion at least partially wrapping around the third semiconductor layer; and
    a dielectric layer at least partially wrapping around the first interfacial layer portion and the second interfacial layer portion.

11. The method of claim 10, further comprising:
    performing an annealing process to the metal layer to cause the scavenging process to the first interfacial layer portion and second interfacial layer portion.

12. The method of claim 11, wherein all areas of the first and second interfacial layer portions are scavenged during the scavenging process.

13. The method of claim 8, wherein a distance between the first layer and third layer is determined based on a predetermined scavenging threshold of the scavenging process.

14. The method of claim 8, wherein at least one of the first layer and the third layer has a profile determined based on a predetermined scavenging threshold of the scavenging process.

15. A method, comprising:
    providing a substrate including a fin element, the fin element including a bottom layer disposed over the substrate, a middle layer disposed over the bottom layer, and a top layer disposed over the middle layer;
    forming a dummy gate structure in a channel region of the fin element;
    forming a source/drain feature in a source/drain region of the fin element adjacent to the dummy gate structure;
    removing the dummy gate structure to form an opening in the channel region to expose the fin element in the channel region;
    removing at least a portion of the middle layer of the fin element exposed in the opening;
    forming an interposing feature in the channel region, the interposing feature at least partially wrapping around the bottom layer and the top layer;
    forming a metal layer along opposing sidewalls of the interposing feature in the channel region; and
    causing a scavenging process to the interposing feature by performing an annealing process to the metal layer.

16. The method of claim 15, further comprising:
    after the removing of the at least the portion of the middle layer, etching the bottom and top layers in the channel region so that each of the bottom and top layers has a predetermined profile.

17. The method of claim 16, further comprising:
    after the etching of the bottom and top layers, growing a silicon layer on the bottom and top layers.

18. The method of claim 16, wherein the predetermined profile is determined based on a predetermined scavenging threshold of the scavenging process.

19. The method of claim 15, wherein a distance between the bottom layer and the top layer is determined based on a predetermined scavenging threshold of the scavenging process.

20. The method of claim 15, wherein the bottom layer includes silicon germanium or germanium.

* * * * *